(12) United States Patent
Miura

(10) Patent No.: US 10,358,720 B2
(45) Date of Patent: Jul. 23, 2019

(54) SUBSTRATE PROCESSING APPARATUS

(71) Applicant: TOKYO ELECTRON LIMITED, Tokyo (JP)

(72) Inventor: Shigehiro Miura, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 265 days.

(21) Appl. No.: 15/202,153

(22) Filed: Jul. 5, 2016

(65) Prior Publication Data

US 2017/0009341 A1 Jan. 12, 2017

(30) Foreign Application Priority Data

Jul. 8, 2015 (JP) .................................. 2015-137105

(51) Int. Cl.
| | |
|---|---|
| *C23C 16/44* | (2006.01) |
| *C23C 16/40* | (2006.01) |
| *C23C 16/458* | (2006.01) |
| *C23C 16/455* | (2006.01) |

(52) U.S. Cl.
CPC ........ *C23C 16/4412* (2013.01); *C23C 16/401* (2013.01); *C23C 16/4584* (2013.01); *C23C 16/45551* (2013.01)

(58) Field of Classification Search
USPC ..................................... 118/730; 156/345.55
See application file for complete search history.

(56) References Cited

U.S. PATENT DOCUMENTS 5,884,009 A * 3/1999 Okase ............... H01L 21/67017
219/405

FOREIGN PATENT DOCUMENTS

| JP | 2008524842 A | 7/2008 |
|---|---|---|
| JP | 2008-222728 A | 9/2008 |
| JP | 2011135003 A | 7/2011 |
| JP | 2013149728 A | 8/2013 |
| KR | 10-2010-0027036 A | 3/2010 |
| KR | 10-2013-0075690 A | 7/2013 |
| WO | 2009017322 A1 | 2/2009 |

* cited by examiner

*Primary Examiner* — Rudy Zervigon
(74) *Attorney, Agent, or Firm* — Nath, Goldberg & Meyer; Jerald L. Meyer

(57) ABSTRACT

A substrate processing apparatus includes: a process chamber; a rotary table provided within the process chamber so as to place a substrate on a surface of the rotary table; a first process gas supply region including a first process gas supply part that supplies a first process gas to the substrate; a second process gas supply region including a second process gas supply part that supplies a second process gas to the substrate; first and second exhaust ports provided below the rotary table; and a conductance reduction part that reduces conductance in the vicinity of the first exhaust port in a route along which the second process gas flows toward the first exhaust port through a communication space, the communication space being generated by upward movement of the rotary table and allowing the first exhaust port and the second exhaust port to communicate with each other.

13 Claims, 17 Drawing Sheets

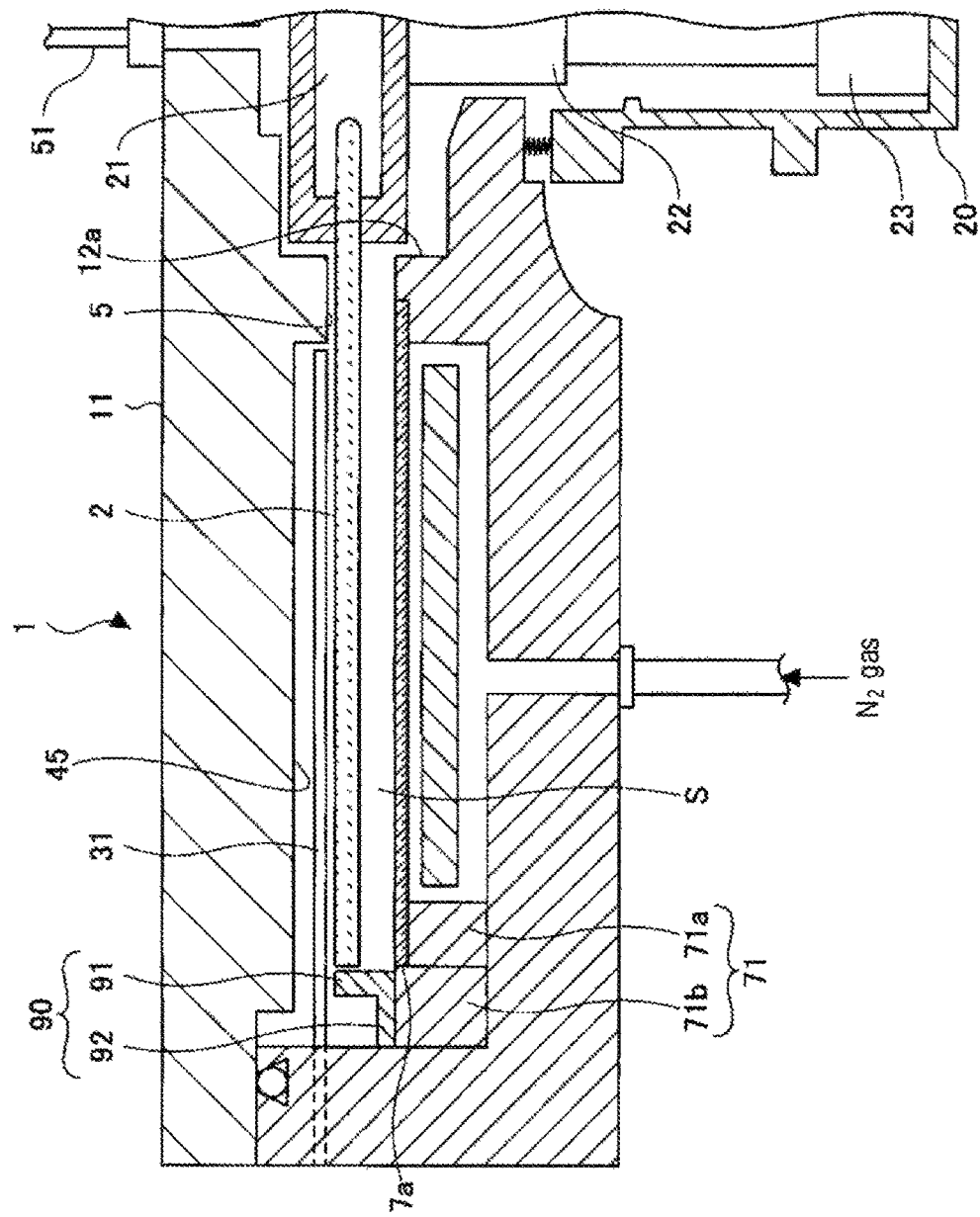

SUBSTRATE PROCESSING APPARATUS

CROSS-REFERENCE TO RELATED APPLICATION

This application claims the benefit of Japanese Patent Application No. 2015-137105, filed on Jul. 8, 2015, in the Japan Patent Office, the disclosure of which is incorporated herein in its entirety by reference.

TECHNICAL FIELD

The present disclosure relates to a substrate processing apparatus.

BACKGROUND

In the related art, there is known a film forming method in which a thin film is formed by sequentially supplying at least two kinds of mutually-reacting reaction gases to a surface of a substrate and laminating a plurality of reaction product layers through the execution of this supply cycle. The film forming method includes a step of placing a substrate on a rotary table accommodated within a vacuum container and rotating the rotary table, a step of supplying a first reaction gas and a second reaction gas to a substrate-placing-region-side surface of the rotary table from a first reaction gas supply means and a second reaction gas supply means installed in the vacuum container in a spaced-apart relationship along a rotation direction, and a step of supplying a separation gas from a separation gas supply means installed in a separation region positioned between the first reaction gas supply means and the second reaction gas supply means in the rotation direction and diffusing the separation gas toward a narrow space between a ceiling surface of the vacuum container and the rotary table at the opposite sides of the separation gas supply means in the rotation direction.

In this film forming method, the reaction gas and the separation gas diffusing toward the opposite sides of the separation region are exhausted from an exhaust port of a first exhaust path opened between a first processing region and the separation region adjoining the first processing region at the downstream side in the rotation direction when viewed from the rotation center of the rotary table and an exhaust port of a second exhaust path opened between a second processing region and the separation region adjoining the second processing region at the downstream side in the rotation direction when viewed from the rotation center of the rotary table. The film forming method includes a step of mutually independently exhausting the gases from the first processing region and the second processing region and a step of mutually independently exhausting the interior of the first exhaust path and the interior of the second exhaust path with a first vacuum exhaust means and a second vacuum exhaust means, respectively. The first reaction gas and the second reaction gas are independently exhausted from the first processing region and the second processing region, respectively. Since a clearance space existing under the rotary table is configured to have an extremely narrow size, the first reaction gas supplied to the first processing region and the second reaction gas supplied to the second processing region are mutually independently exhausted from a first exhaust port and a second exhaust port without passing through the lower side of the rotary table.

However, as a process is diversified in recent years, it is often required that a process be performed in a state in which a clearance is formed under a rotary table. Specifically, in a high-temperature process, when a wafer is loaded into a vacuum container and placed on a rotary table, the wafer may be largely warped. A process cannot be started until the warp is settled. In order to rapidly start a process even a little bit, the rotary table is often configured to move up and down. When placing a wafer, the rotary table is moved down to enlarge a space. If a warp is settled, the rotary table is moved up to perform a process.

In this process, the process is performed in a state in which the rotary table is moved up. Thus, a clearance is generated under the rotary table. The first reaction gas and the second reaction gas are mixed with each other in the clearance. This may make it impossible to perform independent exhaust of the first reaction gas and the second reaction gas. The first reaction gas and the second reaction gas may react with each other to generate a reaction product. Therefore, if the first reaction gas and the second reaction gas react with each other in the vicinity of the first exhaust port or the second exhaust port, an unnecessary reaction product may be generated in the first exhaust port or the second exhaust port. Thus, the interior of the vacuum container may be contaminated.

SUMMARY

Some embodiments of the present disclosure provide a substrate processing apparatus which are capable of performing independent exhaust in first and second exhaust ports even in a process in which clearance is generated under a rotary table.

According to one embodiment of the present disclosure, there is provided a substrate processing apparatus including: a process chamber; a rotary table provided within the process chamber so as to place a substrate on a surface of the rotary table, the rotary table being movable up and down; a first process gas supply region provided at a predetermined location along a circumferential direction of the rotary table, the first process gas supply region including a first process gas supply part that supplies a first process gas to the substrate; a second process gas supply region provided in a spaced-apart relationship with the first process gas supply region along the circumferential direction of the rotary table, the second process gas supply region including a second process gas supply part that supplies a second process gas to the substrate; and first and second exhaust ports provided below the rotary table in a corresponding relationship with the first and second process gas supply regions, respectively. The substrate processing apparatus further includes a conductance reduction part that reduces conductance in the vicinity of the first exhaust port in a route along which the second process gas flows toward the first exhaust port through a communication space, the communication space being generated by upward movement of the rotary table and allowing the first exhaust port and the second exhaust port to communicate with each other.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a view illustrating one example of the relationship between a conductance reduction block and a process gas nozzle.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
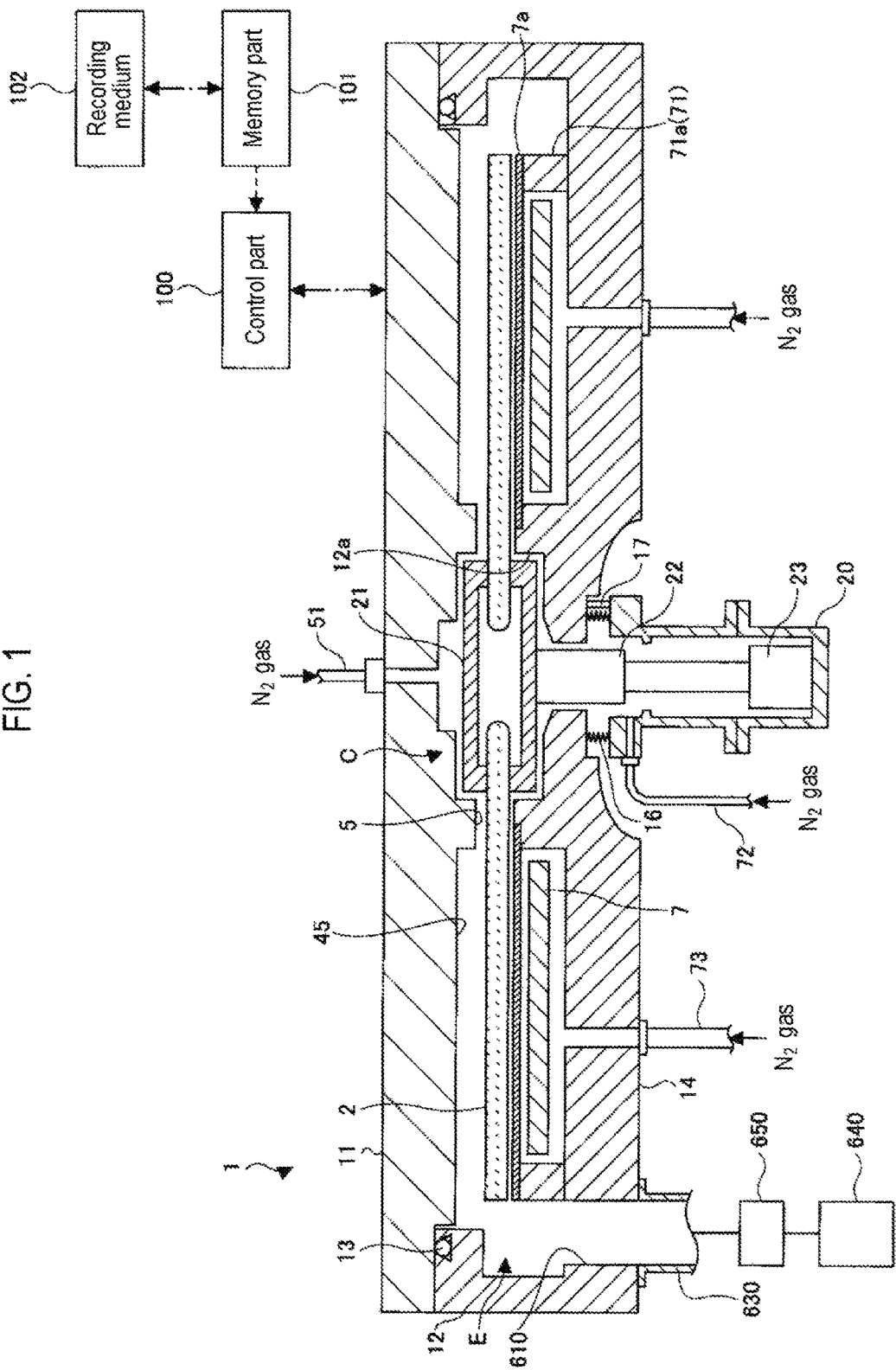
FIG. 1 is a schematic sectional view illustrating a substrate processing apparatus according to an embodiment of the present disclosure.
Figure 2:
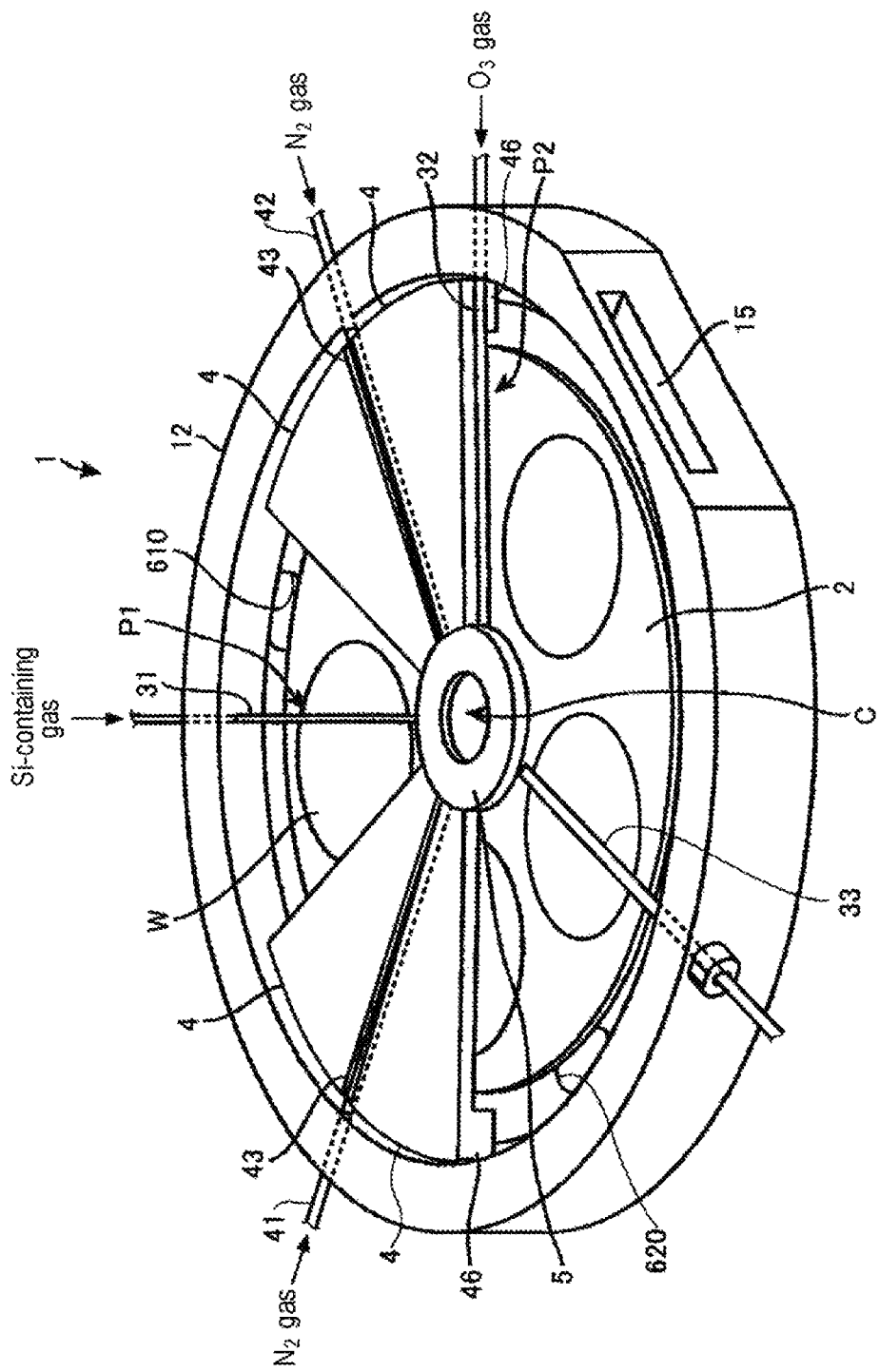
FIG. 2 is a schematic perspective view illustrating the internal configuration of a vacuum container of the substrate processing apparatus illustrated in FIG. 1.
Figure 3:
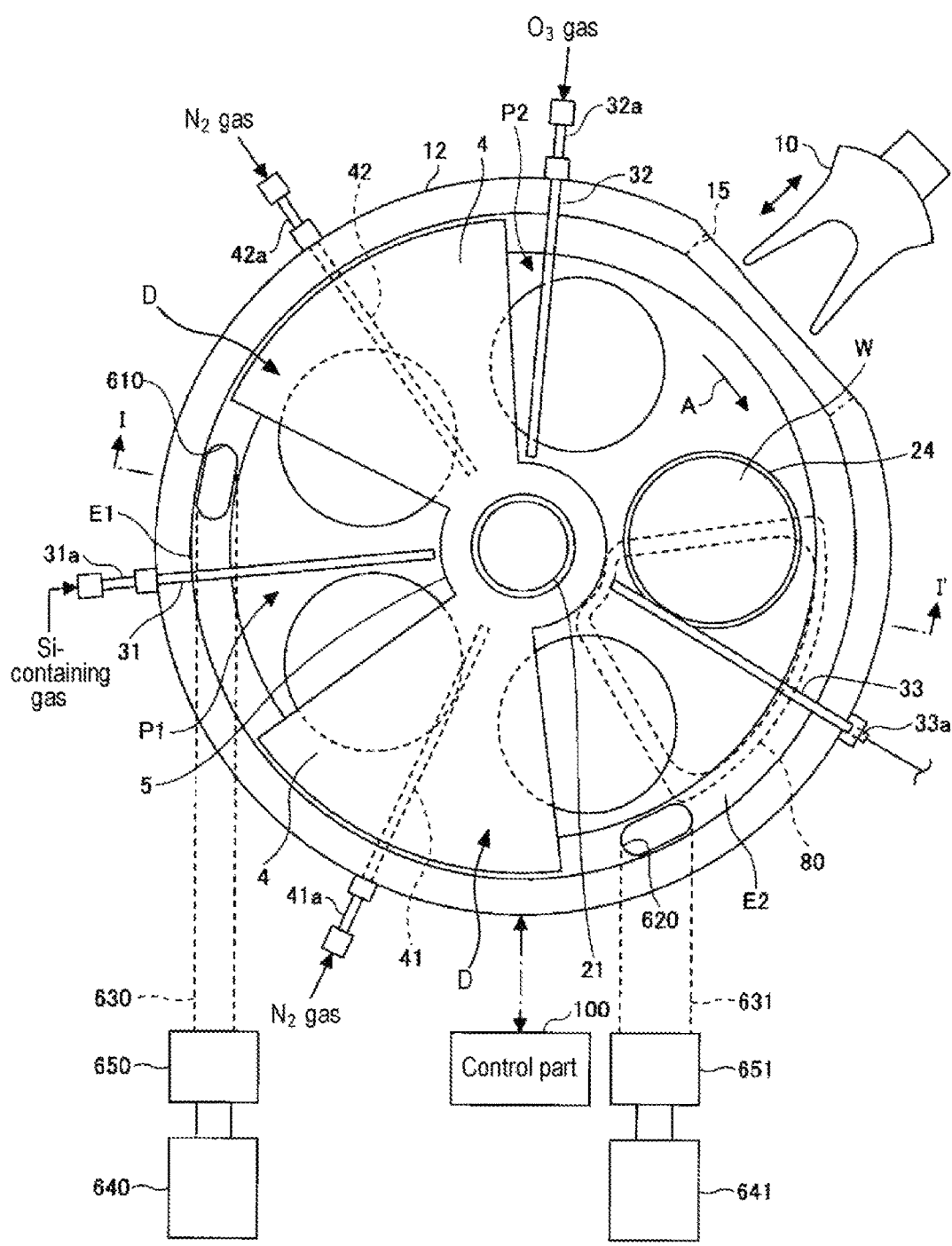
FIG. 3 is a schematic plane view illustrating the internal configuration of the vacuum container of the substrate processing apparatus illustrated in FIG. 1.

Referring to FIGS. 1 to 3, a substrate processing apparatus according to an embodiment of the present disclosure includes a flat vacuum container 1 having a substantially-circular planar shape, and a rotary table 2 installed within the vacuum container 1 and having a rotation center at the center of the vacuum container 1. The vacuum container 1 is a process chamber for accommodating wafers W therein to perform substrate processing. The vacuum container 1 includes a cylindrical container body 12 having a closed bottom, and a ceiling plate 11 air-tightly and detachably attached to an upper surface of the container body 12 through a seal member 13 (see FIG. 1) such as, e.g., an O-ring or the like.

The rotary table 2 is fixed to a cylindrical core portion 21 at the center thereof. The core portion 21 is fixed to an upper end of a vertically-extending rotary shaft 22. The rotary shaft 22 penetrates a bottom portion 14 of the vacuum container 1. The lower end of the rotary shaft 22 is installed in a drive part 23 which rotates the rotary shaft 22 (see FIG. 1) about a vertical axis. The rotary shaft 22 and the drive part 23 are stored within a tubular case body 20 having an open top surface. A flange portion provided in the top surface of the case body 20 is air-tightly attached to the lower surface of the bottom portion 14 of the vacuum container 1, whereby the internal atmosphere and the external atmosphere of the case body 20 are kept in an air-tight state.

As illustrated in FIGS. 2 and 3, circular recess portions 24 for holding a plurality of (five, in the illustrated example) semiconductor wafers (hereinafter referred to as "wafers") W, which are substrates, are formed on the front surface of the rotary table 2 along a rotation direction (circumferential direction). In FIG. 3, for the sake of convenience, there is shown a wafer W held in only one of the recess portions 24. The recess portions 24 have an inner diameter which is a little, for example, 4 mm, larger than the diameter of the wafer W and a depth which is substantially equal to the thickness of the wafer W. Accordingly, if the wafer W is accommodated within one of the recess portions 24, the surface of the wafer W and the surface of the rotary table 2 (the region in which the wafer W is not placed) are flush with each other. On the bottom surface of each of the recess portions 24, there are formed through-holes (not shown) into which, for example, three lift pins (not shown) for supporting the rear surface of the wafer W and moving the wafer W up and down are inserted.

FIGS. 2 and 3 are views for explaining the internal structure of the vacuum container 1. For the sake of convenience in description, the ceiling plate 11 is not shown in FIGS. 2 and 3. As illustrated in FIGS. 2 and 3, at the upper side of the rotary table 2, a process gas nozzle 31, a process gas nozzle 32, separation gas nozzles 41 and 42, and a plasma gas nozzle 33, which are respectively made of, for example, quartz, are disposed in a spaced-apart relationship in the circumferential direction of the vacuum container 1 (in the rotation direction of the rotary table 2 (indicated by arrow A in FIG. 3)). In the illustrated example, the plasma gas nozzle 33, the separation gas nozzle 41, the process gas nozzle 31, the separation gas nozzle 42 and the process gas nozzle 32 are arranged in the named order in the clockwise direction (the rotation direction of the rotary table 2) from a transfer gate 15 which will be described later. These nozzles 33, 31, 32, 41 and 42 are installed to extend from the outer peripheral wall of the vacuum container 1 into the vacuum container 1 and to horizontally extend with respect to the rotary table 2 along the radial direction of the container body 12. Gas introduction ports 33a, 31a, 32a, 41a and 42a (see FIG. 3), which are the base end portions of the respective nozzles 33, 31, 32, 41 and 42, are fixed to the outer peripheral wall of the container body 12.

As indicated in a simplified manner by a broken line in FIG. 3, a plasma generator 80 is installed above the process gas nozzle 33. The plasma generator 80 may be installed as needed and is not essential. Thus, in the present embodiment, the plasma generator 80 is shown in a simplified manner.

The process gas nozzle 31 is connected to a supply source (not shown) of a Si (silicon)-containing gas as a first process gas via a pipeline, a flow rate controller and the like, which are not shown. The process gas nozzle 32 is connected to a supply source (not shown) of an oxidizing gas as a second process gas via a pipeline, a flow rate controller and the like, which are not shown. The separation gas nozzles 41 and 42 are connected to a supply source (not shown) of a nitrogen ($N_2$) gas as a separation gas via a pipeline, a flow rate controller and the like, which are not shown.

As the Si-containing gas, it may be possible to use, for example, an organic aminosilane gas such as diisopropylaminosilane or the like. As the oxidizing gas, it may be possible to use, for example, an $O_3$ (ozone) gas, an $O_2$ (oxygen) gas or a mixed gas thereof.

In the process gas nozzles 31 and 32, a plurality of gas injection holes 34 opened toward the rotary table 2 is arranged at intervals of, for example, 10 mm along the longitudinal direction of the process gas nozzles 31 and 32. A region existing under the process gas nozzle 31 becomes a first processing region P1 for causing the Si-containing gas to be adsorbed onto the wafer W. A region existing under the process gas nozzle 32 becomes a second processing region P2 for oxidizing the Si-containing gas adsorbed onto the wafer W in the first processing region P1. The first processing region P1 and the second processing region P2 are regions to which the first process gas and the second process gas are respectively supplied. Thus, the first processing region P1 and the second processing region P2 may be also referred to as a first process gas supply region P1 and a second process gas supply region P2, respectively.

The process gas nozzles 31 and 32 and the plasma gas nozzle 33 are illustrated as one example of a gas supply means. The gas supply means may not be necessarily configured by nozzles as long as the gas supply means can supply gases. For example, if necessary, shower heads may be used in place of the nozzles.

Referring to FIGS. 2 and 3, two convex portions 4 are installed within the vacuum container 1. The convex portions 4 and the separation gas nozzles 41 and 42 constitute separation regions D. As will be described later, the convex portions 4 are attached to the rear surface of the ceiling plate 11 so as to protrude toward the rotary table 2. Each of the convex portions 4 has a fan-like planar shape with the apex portion thereof cut in an arc shape. In the present embodiment, each of the convex portions 4 is disposed so that the inner arc thereof is connected to a protrusion portion 5 (which will be described later) and the outer arc thereof extends along the inner circumferential surface of the container body 12 of the vacuum container 1.

Figure 4:
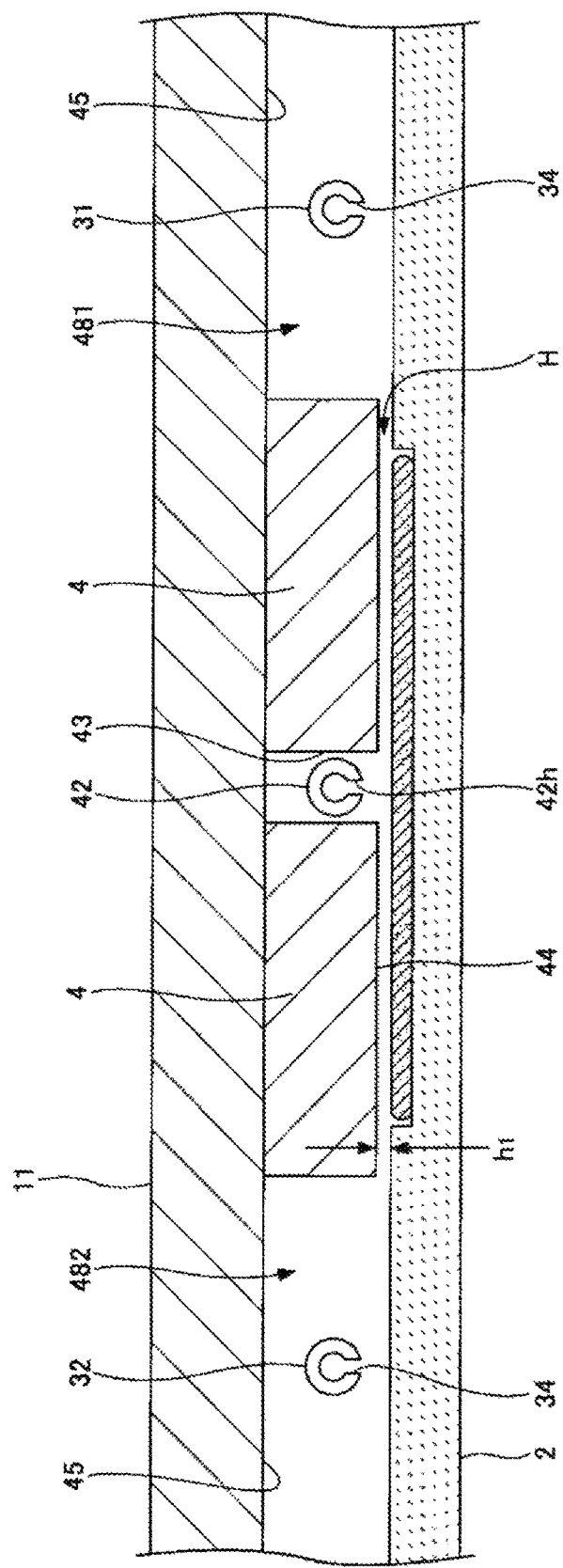
FIG. 4 is a schematic sectional view of the vacuum container taken along a concentric circle of a rotary table rotatably installed within the vacuum container of the substrate processing apparatus illustrated in FIG. 1.

FIG. 4 illustrates a cross section of the vacuum container 1 taken along a concentric circle of the rotary table 2 from the process gas nozzle 31 to the process gas nozzle 32. As illustrated in FIG. 4, each of the convex portions 4 is attached to the rear surface of the ceiling plate 11. Therefore, a flat low ceiling surface 44 (a first ceiling surface), which is the lower surface of each of the convex portions 4, and high ceiling surfaces 45 (second ceiling surfaces) higher than the ceiling surface 44, which are positioned at the opposite sides of the ceiling surface 44 in the circumferential direction, exist within the vacuum container 1. The ceiling surface 44 has a fan-like planar shape with the apex portion thereof cut in an arc shape. Furthermore, as illustrated in FIG. 4, a groove portion 43 extending in the radial direction is formed at the center of each of the convex portions 4 in the circumferential direction. The separation gas nozzle 42 is accommodated within the groove portion 43. Similarly, a groove portion 43 is formed in the other convex portion 4. The separation gas nozzle 41 is accommodated within the groove portion 43. Furthermore, the process gas nozzles 31 and 32 are respectively installed in spaces 481 and 482 existing under the high ceiling surfaces 45. These process gas nozzles 31 and 32 are spaced apart from the ceiling surfaces 45 and are installed in the vicinity of the wafers W.

Furthermore, a plurality of gas injection holes 42h (see FIG. 4) opened toward the rotary table 2 is formed in the separation gas nozzles 41 and 42 accommodated in the groove portions 43 of the convex portions 4 and is arranged at intervals of, for example, 10 mm along the longitudinal direction of the separation gas nozzles 41 and 42.

The ceiling surface 44 forms a separation space H, which is a narrow space, with respect to the rotary table 2. If a $N_2$ gas is supplied from the injection holes 42h of the separation gas nozzle 42, the $N_2$ gas flows toward the spaces 481 and 482 through the separation space H. At this time, the pressure in the separation space H can be made higher than the pressure in the spaces 481 and 482 by the $N_2$ gas, because the volume of the separation space H is smaller than the volumes of the spaces 481 and 482. That is to say, the separation space H having a high pressure is formed between the spaces 481 and 482. Furthermore, the $N_2$ gas flowing out from the separation space H to the spaces 481 and 482 acts as a counter flow against the Si-containing gas coming from the first processing region P1 and the oxidizing gas coming from the second processing region P2. Thus, the Si-containing gas coming from the first processing region P1 and the oxidizing gas coming from the second processing region P2 are separated by the separation space H. Accordingly, it is possible to restrain the Si-containing gas and the oxidizing gas from being mixed and reacting with each other within the vacuum container 1.

Furthermore, the height h1 of the ceiling surface 44 with respect to the upper surface of the rotary table 2 may be set at a height suitable for making the pressure in the separation space H higher than the pressure in the spaces 481 and 482, in view of the internal pressure of the vacuum container 1, the rotation speed of the rotary table 2, the supply amount of the separation gas ($N_2$ gas) and the like used in a film forming process.

The protrusion portion 5 (see FIGS. 2 and 3) which surrounds the outer periphery of the core portion 21 for fixing the rotary table 2 is formed on the lower surface of the ceiling plate 11. In the present embodiment, the protrusion portion 5 continuously extends from the rotation-center-side portions of the convex portions 4. The lower surface of the protrusion portion 5 is formed at the same height as the height of the ceiling surface 44.

Figure 5:
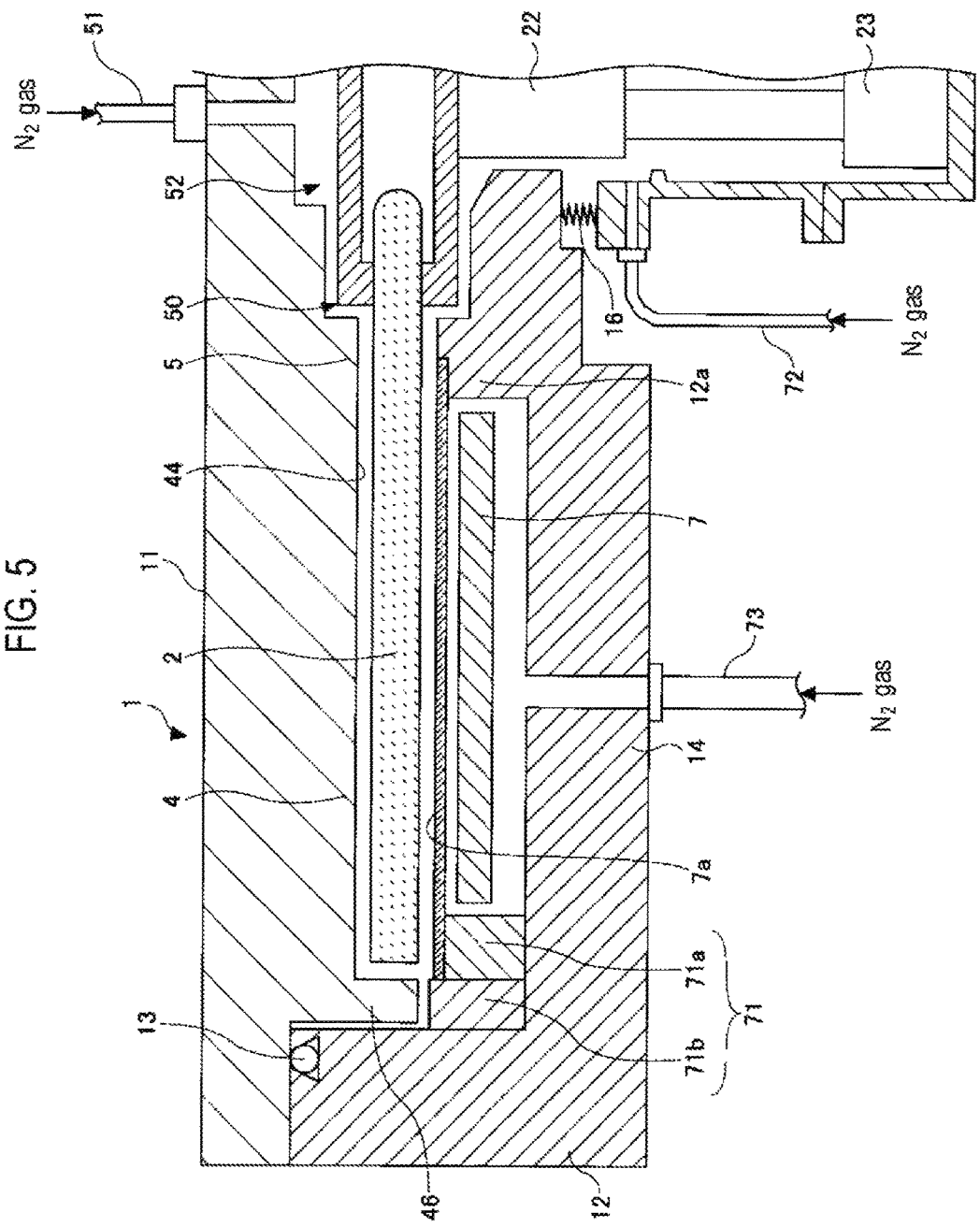
FIG. 5 is another schematic sectional view of the substrate processing apparatus illustrated in FIG. 1.

FIG. 1 referred to above is a sectional view taken along line I-I' in FIG. 3, illustrating the regions in which the ceiling surfaces 45 are installed. On the other hand, FIG. 5 is a sectional view illustrating the region in which the ceiling surface 44 is installed. As illustrated in FIG. 5, a bent portion 46 bent in an L shape so as to face an outer end surface of the rotary table 2 is formed in a peripheral edge portion of each of the fan-like convex portions 4 (in an outer-edge-side portion of the vacuum container 1). Similar to the convex portions 4, the bent portion 46 restrains the process gases from infiltrating from the opposite sides of the separation region D, thereby suppressing mixture of the gases. The fan-like convex portions 4 are provided in the ceiling plate 11. The ceiling plate 11 is detachable from the container body 12. A small gap exists between the outer circumferential surface of the bent portion 46 and the container body 12. A gap between the inner circumferential surface of the bent portion 46 and the outer end surface of the rotary table 2 and a gap between the outer circumferential surface of the bent portion 46 and the container body 12 may be set, for example, at the same dimension as the height of the ceiling surface 44 with respect to the upper surface of the rotary table 2.

In the separation region D, as illustrated in FIG. 5, the inner peripheral wall of the container body 12 is formed into a vertical surface in the vicinity of the outer circumferential surface of the bent portion 46. However, in the regions other than the separation region D, as illustrated in FIG. 1, the inner peripheral wall of the container body 12 is outwardly concave over a range which spans from the portion facing the outer end surface of the rotary table 2 to the bottom portion 14. Hereinafter, for the sake of convenience in description, the concave portion having a substantially rectangular cross-sectional shape will be referred to as an exhaust region. Specifically, the exhaust region communicating with the first processing region P1 will be referred to as a first exhaust region E1. The exhaust region communicating with the second processing region P2 will be referred to as a second exhaust region E2. As illustrated in FIGS. 1 to 3, a first exhaust port 610 and a second exhaust port 620 are formed in the bottom portions of the first exhaust region E1 and the second exhaust region E2, respectively. As illustrated in FIGS. 1 and 3, the first exhaust port 610 and the second exhaust port 620 are respectively connected to, for example, vacuum pumps 640 and 641, which are vacuum exhaust means, via exhaust pipes 630 and 631. Furthermore, an automatic pressure controller (APC) 650, which is a pressure regulation means, is installed in the exhaust pipe 630 between the first exhaust port 610 and the vacuum pump 640. Similarly, an automatic pressure controller 651, which is a pressure regulation means, is installed in the exhaust pipe 631 between the second exhaust port 620 and the vacuum pump 641. Thus, the exhaust pressures in the first exhaust port 610 and the second exhaust port 620 can be controlled independently of each other.

As illustrated in FIGS. 1 and 5, a heater unit 7, which is a heating means, is installed in the space between the rotary table 2 and the bottom portion 14 of the vacuum container 1. Thus, the wafers W on the rotary table 2 are heated to a temperature determined by a process recipe (e.g., 450 degrees C.) through the rotary table 2. At the lower side of the vicinity of a peripheral edge of the rotary table 2, there is installed a ring-shaped cover member 71 in order to suppress infiltration of the gases into the region under the rotary table 2 by partitioning an atmosphere in an area spanning from the space existing above the rotary table 2 to the exhaust regions E1 and E2 and an atmosphere in which the heater unit 7 is placed. The cover member 71 includes an inner member 71a installed so as to face the outer edge portion of the rotary table 2 and the outer side of the outer edge portion of the rotary table 2 from the lower side, and an outer member 71b installed between the inner member 71a and the inner wall surface of the vacuum container 1. The outer member 71b is installed in close proximity to the bent portion 46 at the lower side of the bent portion 46 formed in the outer edge portion of each of the convex portions 4 in the separation region D. The inner member 71a surrounds the entire periphery of the heater unit 7 at the lower side of the outer edge portion of the rotary table 2 (and at the lower side of the region existing slightly outward of the outer edge portion of the rotary table 2).

In the region closer to the rotation center than the space in which the heater unit 7 is disposed, the bottom portion 14 protrudes upward so as to approach the core portion 21 in the vicinity of the central region of the lower surface of the rotary table 2, thereby forming a protrusion portion 12a. A narrow space exists between the protrusion portion 12a and the core portion 21. Furthermore, a narrow space exists between the inner circumferential surface of the through-hole of the bottom portion 14, through which the rotary shaft 22 passes, and the rotary shaft 22. These narrow spaces communicate with the case body 20. In the case body 20, there is installed a purge gas supply pipe 72 for supplying a $N_2$ gas as a purge gas into the narrow spaces to purge the narrow spaces. In the bottom portion 14 of the vacuum container 1, a plurality of purge gas supply pipes 73 for purging the arrangement space of the heater unit 7 is installed at specified angular intervals in the circumferential direction under the heater unit 7 (Only one of the purge gas supply pipes 73 is shown in FIG. 5). Furthermore, a lid member 7a configured to cover a gap between the inner peripheral wall of the outer member 71b (the upper surface of the inner member 71a) and the upper end of the protrusion portion 12a in the circumferential direction is installed between the heater unit 7 and the rotary table 2 in order to suppress infiltration of the gases into the region in which the heater unit 7 is installed. The lid member 7a may be made of, for example, quartz.

A separation gas supply pipe 51 is connected to the central portion of the ceiling plate 11 of the vacuum container 1 and is configured to supply a $N_2$ gas as a separation gas to a space 52 between the ceiling plate 11 and the core portion 21. The separation gas supplied to the space 52 passes through a narrow gap 50 between the protrusion portion 5 and the rotary table 2 and flows toward the peripheral edge of the rotary table 2 along the wafer-placing-region-side surface of the rotary table 2. The pressure in the space 50 can be kept higher than the pressure in the spaces 481 and 482 by the separation gas. Accordingly, due to the existence of the space 50, the Si-containing gas supplied to the first processing region P1 and the oxidizing gas supplied to the second processing region P2 are restrained from passing through a central region C and from being mixed with each other. That is to say, the space 50 (or the central region C) can function just like the separation space H (or the separation region D).

As illustrated in FIGS. 2 and 3, the transfer gate 15 for performing delivery of the wafer W as a substrate between an external transfer arm 10 and the rotary table 2 is formed in the sidewall of the vacuum container 1. The transfer gate 15 is opened and closed by a gate valve not shown. The delivery of the wafer W is performed between the recess portion 24 as a wafer placing region of the rotary table 2 and the transfer arm 10 in the position facing the transfer gate 15. Thus, delivery-purpose lift pins (not shown) for penetrating the recess portion 24 and lifting the wafer W from the rear surface thereof and a lift mechanism (not shown) for moving the lift pins up and down are installed in a region corresponding to the delivery position at the lower side of the rotary table 2.

As illustrated in FIG. 1, a control part 100 formed of a computer and configured to control an overall operation of the substrate processing apparatus is installed in the substrate processing apparatus according to the present embodiment. A program which causes the substrate processing apparatus to carry out below-described substrate processing under the control of the control part 100 is stored in a memory of the control part 100. The program includes a step group which is organized so as to perform below-described substrate processing. The program is stored in a recording medium 102 such as a hard disk, a compact disk, a magneto-optical disk, a memory card, a flexible disk or the like. The program is read into a memory part 101 by a specified reading device and is installed in the control part 100.

Furthermore, as illustrated in FIG. 1, a bellows 16 is installed between the bottom portion 14 of the container body 12 and the case body 20 around the rotary shaft 22. An elevator mechanism 17 capable of moving the rotary table 2 up and down and changing the height of the rotary table 2 is installed outside the bellows 16. The rotary table 2 is moved up and down by the elevator mechanism 17. The bellows 16 is expanded and contracted in response to the up/down movement of the rotary table 2. It is therefore possible to change the distance between the ceiling surface 45 and the wafer W. By installing the bellows 16 and the elevator mechanism 17 in a portion of the components that constitute the rotary shaft 22 of the rotary table 2, it is possible to change the distance between the ceiling surface 45 and the wafer W while keeping the processed surface of the wafer W in parallel. The elevator mechanism 17 may be realized in many different configurations as long as the elevator mechanism 17 can move the rotary table 2 up and down. For example, it may be possible to employ a structure in which the length of the rotary shaft 22 is expanded and contracted by gears or the like.

The reason for installing this elevator mechanism 17 is as follows. In the case where substrate processing is performed while maintaining the interior of the vacuum container 1 at a high temperature of 400 degrees C. or more, even if the heater unit 7 is stopped in order to unload and load the wafer W, the interior of the vacuum container 1 is still kept at a high temperature. When the wafer W is loaded into the vacuum container 1 and is placed on the rotary table 2, there is generated a phenomenon that the wafer W is largely warped.

Figure 6:
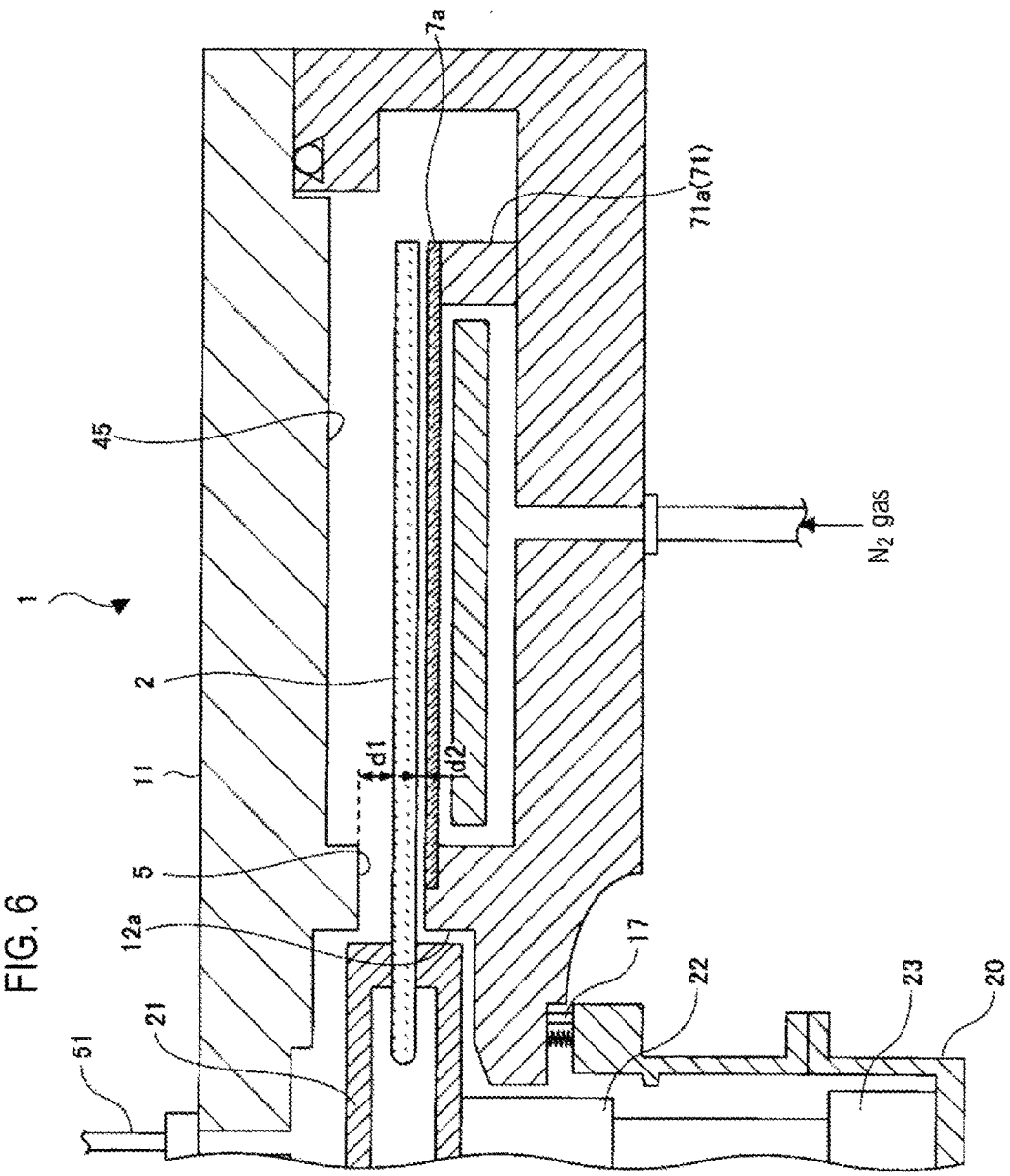
FIG. 6 is a view illustrating one example of a state in which the rotary table is moved down.

FIG. 6 is a partially-enlarged view illustrating one example of a state in which the rotary table 2 is moved down. As illustrated in FIG. 6, when the wafer W is placed on the rotary table 2, the rotary table 2 is moved down to maintain a space having such a distance d1 that the wafer W does not make contact with the ceiling surface 44 even if the wafer W is warped (The ceiling surface 44 and the lower surface of the protrusion portion 5 have the same height). On the other hand, when the warp of all of the wafers W is settled and when the wafers W are subjected to a film forming process by rotating the rotary table 2, it is necessary to maintain a narrow clearance between the wafers W and the ceiling surface 44. Thus, the film forming process is performed in a state in which the rotary table 2 is moved up. By installing the elevator mechanism 17 for moving the rotary table 2 up and down, it is possible to prevent damage of the wafers W which may otherwise be caused by the contact of the wafers W with the ceiling surfaces 44 and 45. Furthermore, even if the wafers W placed on the rotary table 2 are still in a warped state, the wafers W can be sequentially placed on the recess portions 24 by intermittently rotating the rotary table 2 without waiting for the settlement of the warp. This makes it possible to improve the productivity. In other words, since a margin exists between the rotary table 2 and the ceiling surfaces 44 and 45, it is possible to place one wafer W on one recess portion 24 of the rotary table 2 and then place the next wafer W on the next recess portion 24 before the warp of the placed wafer W is settled. This makes it possible to shorten the total time required in placing a plurality of wafers W on the rotary table 2 and to improve the productivity. In addition, the distance d1 of the space between the rotary table 2 and the ceiling surface 44 may be set to fall within a range of 8 to 18 mm, specifically 10 to 15 mm More specifically, the distance d1 may be set at, for example, 13 mm.

As illustrated in FIG. 6, when the rotary table 2 is moved down, a space having a distance d1 to the ceiling surface 44 is formed above the rotary table 2 and a distance d2 of a gap between the lower surface of the rotary table 2 and the lid member 7a is sharply reduced to, for example, about 3 mm. In this state, there is little possibility that the process gas passes through the underside of the rotary table 2. Thus, there is little possibility that the second process gas supplied to the second processing region P2 passes through the underside of the rotary table 2 and reaches the first processing region P1, after which the second process gas is exhausted from the first exhaust port 610.

Figure 7:
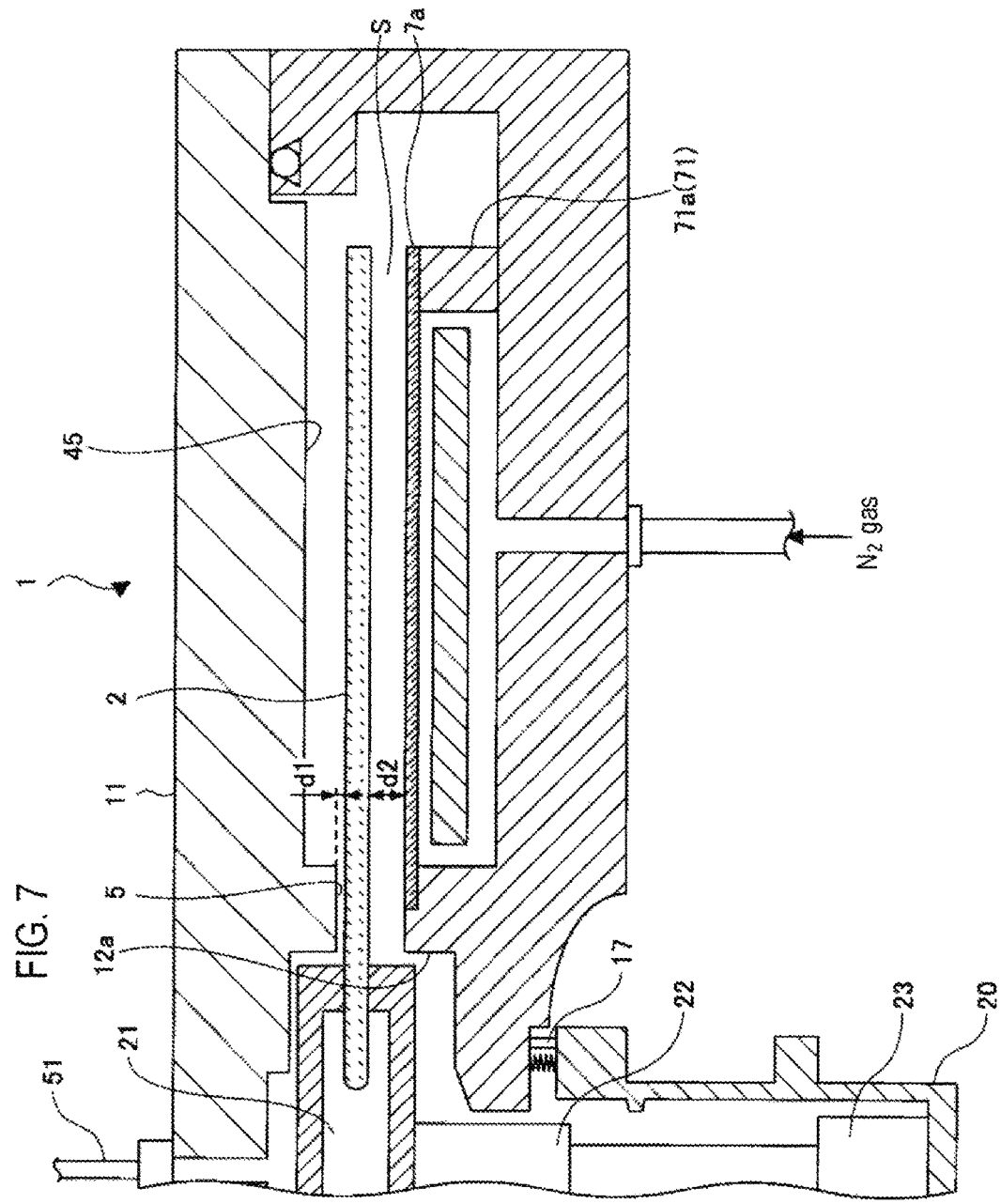
FIG. 7 is a view illustrating one example of a state in which the rotary table is moved up.

FIG. 7 is a view illustrating one example of a state in which the rotary table 2 is moved up. As illustrated in FIG. 7, if the rotary table 2 is moved up, the distance d1 of the gap between the rotary table 2 and the process gas nozzles 31 and 32 is sharply reduced to, for example, about 3 mm. However, the distance d2 of the gap between the rotary table 2 and the lid member 7a grows larger. Thus, there is formed a communication space S through which the process gas can pass. As described above, the clearance (distance D2) of 3 mm is initially formed between the lower surface of the rotary table 2 and the lid member 7a. If the clearance (distance D1) of 3 mm is formed between the upper surface of the rotary table 2 and the ceiling surface 44 after the rotary table 2 is moved up, the distance d2 of the gap between the lower surface of the rotary table 2 and the lid member 7a also becomes about 8 to 18 mm, for example, 13 mm. If the wafers W are subjected to a process such as a film forming process or the like in this state, the process gas passes through a communication space formed under the rotary table 2. Thus, there is generated a phenomenon that the second process gas reaches the first processing region P1 and is exhausted from the first exhaust port 610. In this case, the first process gas and the second process gas make a chemical vapor deposition (CVD) reaction, whereby an unnecessary reaction product such as a silicon oxide film or the like is deposited in the first exhaust port 610.

In order to prevent this phenomenon, in the substrate processing apparatus according to the embodiment of the present disclosure, a conductance reduction means configured to reduce conductance in the vicinity of the first exhaust port 610 when the second process gas flows toward the first exhaust port 610 is installed to prevent the second process gas from being exhausted from the first exhaust port 610. Hereinafter, the configuration and function of the conductance reduction means will be described in detail.

Figure 8:
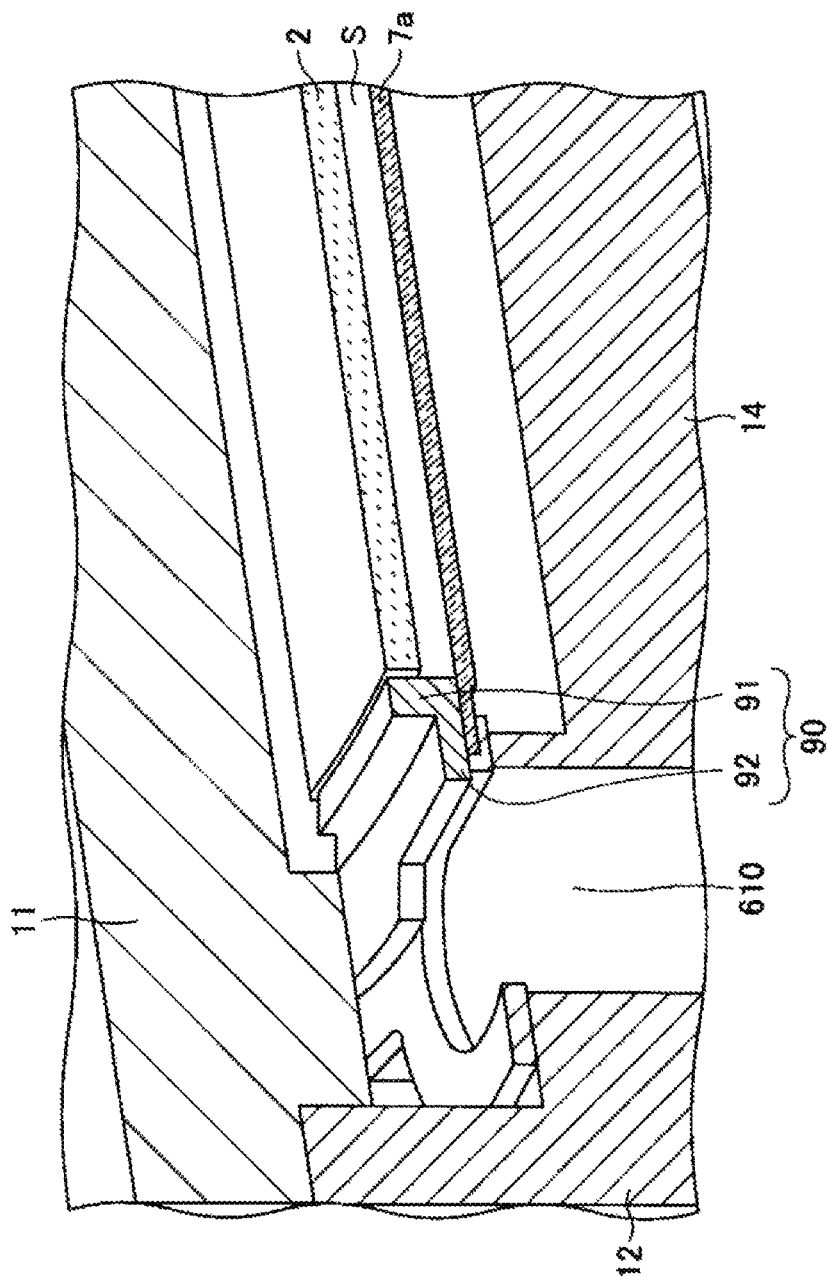
FIG. 8 is an enlarged view of the vicinity of a first exhaust port in one example of the substrate processing apparatus according to the embodiment of the present disclosure.

FIG. 8 is an enlarged view of the vicinity of the first exhaust port 610 in one example of the substrate processing apparatus according to the embodiment of the present disclosure. As illustrated in FIG. 8, a conductance reduction block 90 as a conductance reduction part is installed between the rotary table 2 and the first exhaust port 610. The conductance reduction block 90 is installed outside the outer peripheral surface of the rotary table 2 and is installed so as to cover the rotary table 2 and the communication space S existing under the rotary table 2 from the outer side thereof. The conductance reduction block 90 includes a wall surface 91 extending in a vertical direction and a horizontal surface 92 extending outward from a lower end of the wall surface 91. The conductance reduction block 90 has an L-like cross-sectional shape as a whole. The wall surface 91 has such a height that the wall surface 91 can cover the rotary table 2 and the communication space S from the side surface in a state in which the rotary table 2 is moved up and the communication space S is formed under the rotary table 2. By installing the wall surface 91 at the outer side of the rotary table 2 in this way, it is possible to increase the pressure of the communication space S existing under the rotary table 2 in the vicinity of the first exhaust port 610, thereby reducing the conductance. In other words, the first exhaust port 610 is vacuum-exhausted by the vacuum pump 640 and, therefore, the pressure in the first exhaust port 610 is lower than the pressure in the surrounding area. By installing the wall surface 91 in a route between the process gas nozzle 32 and the first exhaust port 610, it is possible to reduce the conductance in the vicinity of the first exhaust port 610 and to prevent the second process gas from reaching the first exhaust port 610. The distance (clearance) between the wall surface 91 and the outer peripheral surface of the rotary table 2 may be set to fall within a range of, for example, 0.5 to 4 mm. The reason is that by setting the clearance having such a narrow gap, it is possible to increase the pressure of the communication space S in the vicinity of the first exhaust port 610 and to sufficiently reduce the conductance.

Furthermore, the horizontal surface 92 horizontally extends from the lower end of the wall surface 91 at a predetermined width and extends in an arc shape along the outer peripheral surface of the rotary table 2. The horizontal surface 92 is placed on the bottom surface in which the first exhaust port 610 is formed. The horizontal surface 92 covers the bottom surface in which the first exhaust port 610 is formed. The horizontal surface 92 functions as a support portion which supports the wall surface 91.

FIG. 9 is a view illustrating one example of the relationship between the conductance reduction block 90 and the process gas nozzle 31. As illustrated in FIG. 9, the process gas nozzle 31 is disposed above the conductance reduction block 90. The clearance between the process gas nozzle 31 and the upper surface of the wall surface 91 of the conductance reduction block 90 may be set to fall within a range of, for example, 2 to 5 mm, specifically at, for example, 2.5 mm.

The conductance reduction block 90 may be made of different materials as long as the conductance reduction block 90 includes the wall surface 91 capable of covering the outer side of the rotary table 2 and the communication space S from the side surface. From the viewpoint of preventing contamination, similar to the rotary table 2, the conductance reduction block 90 may be made of, for example, quartz.

Figure 10A:
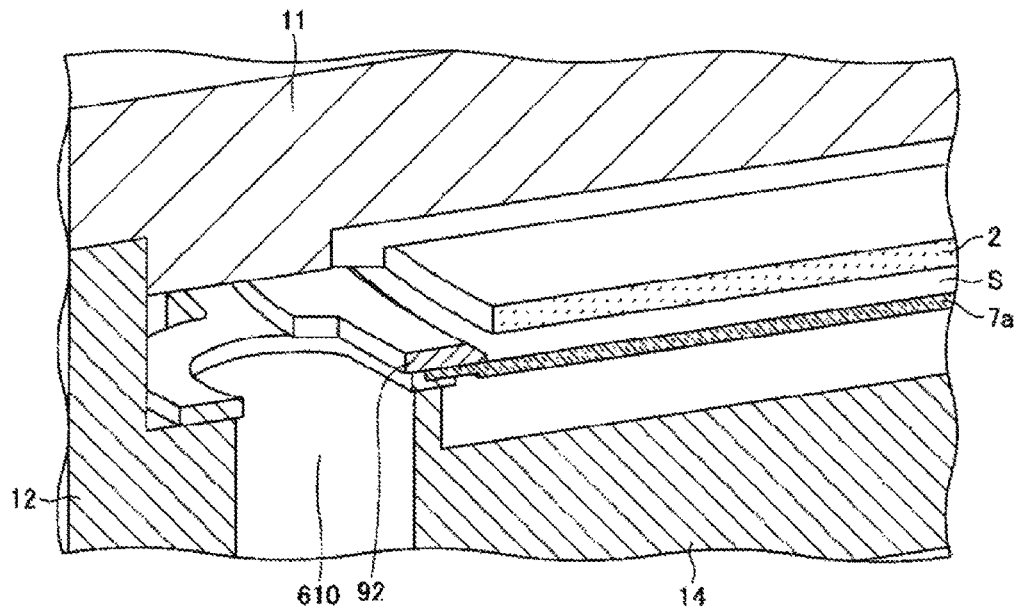
FIGS. 10A and 10B are views illustrating one example of a substrate processing apparatus according to a comparative example.
Figure 10B:
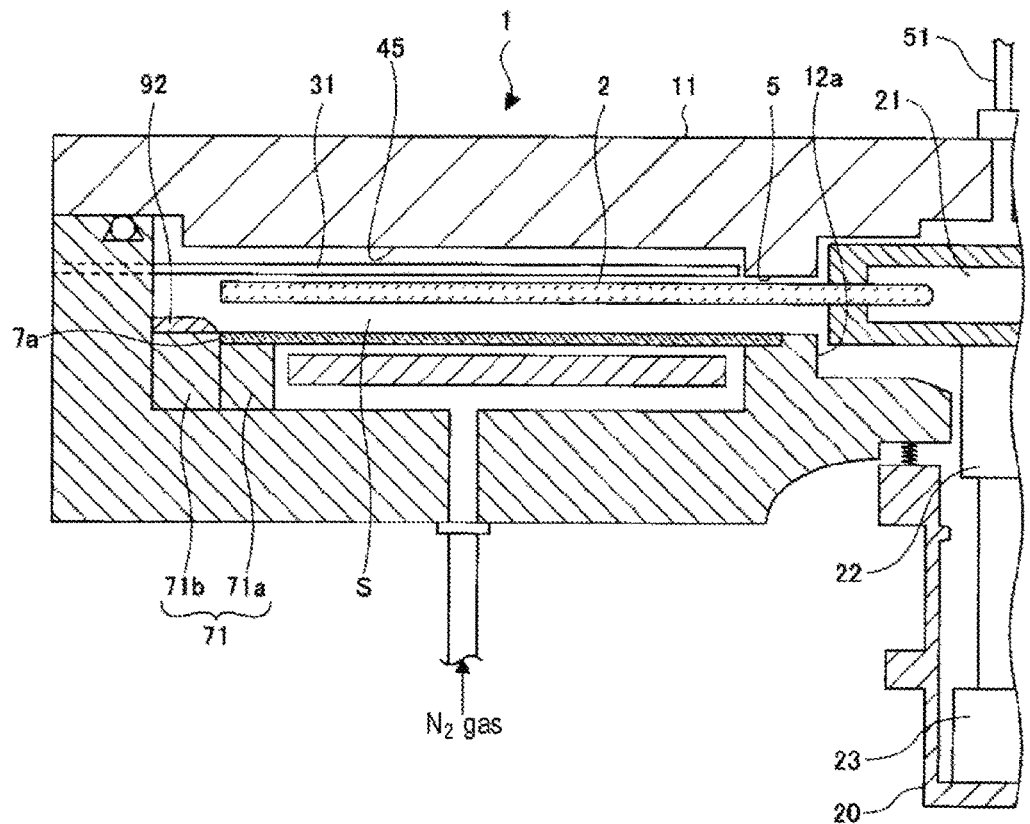

FIGS. 10A and 10B are views illustrating one example of a substrate processing apparatus according to a comparative example in which the wall surface 91 of the conductance reduction block 90 is not formed and only the horizontal surface 92 is installed. FIG. 10A is a view illustrating the configuration in the vicinity of the first exhaust port 610. FIG. 10B is a view illustrating the configuration in the vicinity of the process gas nozzle 31.

As illustrated in FIG. 10A, if the wall surface 91 extending in the vertical direction does not exist, the communication space S directly communicates with the first exhaust port 610, in which state the second process gas easily flows toward the first exhaust port 610. While the vicinity of the first exhaust port 610 is not shown in FIG. 10B, it can be noted that the communication space S communicates with the space existing at the outer side of the rotary table 2, thereby enabling the second process gas to easily flow toward the first exhaust port 610.

As can be seen from the comparison with FIGS. 10A and 10B, by installing the conductance reduction block 90 including the wall surface 91 on the outer peripheral surface of the rotary table 2, it is possible to reduce the conductance in the vicinity of the first exhaust port 610 and to prevent the second process gas from readily reaching the first exhaust port 610.

Figure 11:
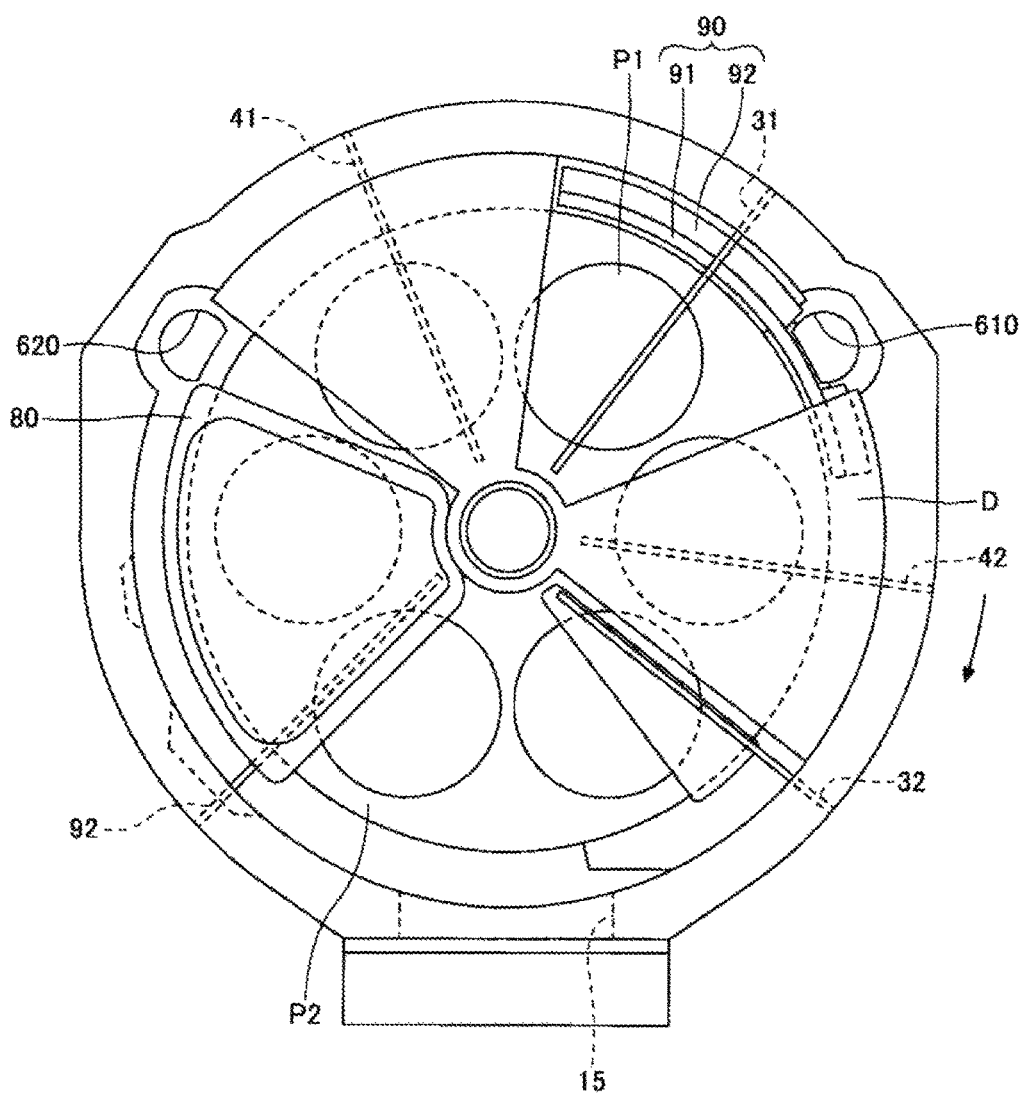
FIG. 11 is a plane view for explaining the plane arrangement of a conductance reduction block of the substrate processing apparatus according to the embodiment of the present disclosure.

FIG. 11 is a plane view for explaining the plane arrangement of the conductance reduction block of the substrate processing apparatus according to the embodiment of the present disclosure. As illustrated in FIG. 11, the conductance reduction block 90 is installed so as to provide a shield between the first exhaust port 610 and the process gas nozzle 32. In order to reduce the conductance of the communication space S which interconnects the first exhaust port 610 and the process gas nozzle 32, the conductance reduction block 90 may be installed so as to cover the first exhaust port 610 with respect to the process gas nozzle 32. The conductance reduction block 90 is installed so as to cover the entirety of the outer periphery of the first processing region P1 and is installed so as to cover about ¼ of the upstream section of the separation region D installed at the downstream side in the rotation direction of the rotary table 2. At the upstream side, the conductance reduction block 90 extends to the upstream end of the first processing region P1. As described above, in order to sufficiently reduce the conductance of the first exhaust port 610 and the vicinity thereof, the conductance reduction block 90 may be installed along the outer peripheral surface of the rotary table 2 so as to extend to the separation region D through the entirety of the first processing region P1. On the other hand, if the second process gas does not reach the first exhaust port 610, the conductance reduction block 90 may be installed in a narrower portion. For example, the conductance reduction block 90 may be installed only in a portion of the first processing region P1. In this way, the conductance reduction block 90 may be installed at different locations and with different arrangements depending on the use thereof.

Next, descriptions will be made on the substrate processing performed through the use of the substrate processing apparatus according to the embodiment of the present disclosure. In the following descriptions, reference will be appropriately made to the drawings referred to thus far.

First, the rotary table 2 is completely moved down. In this state, the gate valve not shown is opened. The wafer W is delivered from the outside into the recess portion 24 of the rotary table 2 through the transfer gate 15 (see FIG. 3) by the transfer arm 10. The downward movement of the rotary table 2 may be performed by controlling the elevator mechanism 17 with the control part 100. The delivery of the wafer W is performed by causing the lift pins not shown to move upward from the underside of the vacuum container 1 through the through-holes of the bottom surface of the recess portion 24 when the recess portion 24 is stopped in the position facing the transfer gate 15. The delivery of the wafer W is performed by intermittently rotating the rotary table 2. Thus, the wafers W are respectively placed into the five recess portions 24 of the rotary table 2. At this time, a warp may be generated in the wafer W. Since the rotary table 2 is moved down to form a space above the rotary table 2, the wafers W are placed on the recess portions 24 one after another by intermittently rotating the rotary table 2 without waiting for the settlement of the warp of the wafers W. If the placing of the wafers W is completed and if the warp of the wafers W is sufficiently reduced, the control part 100 controls the elevator mechanism 17 to move the rotary table 2 upward and to stop the rotary table 2 in a position suitable for performing the substrate processing.

Subsequently, the gate valve is closed and the vacuum container 1 is evacuated to a lowest ultimate vacuum level by the vacuum pump 640. Thereafter, an Ar gas or a $N_2$ gas, which is a separation gas, is injected at a predetermined flow rate from the separation gas nozzles 41 and 42. An Ar gas or a $N_2$ gas is also injected at a predetermined flow rate from the separation gas supply pipe 51 and the purge gas supply pipes 72 and 73.

Subsequently, the wafers W are heated to, for example, 400 degrees C. by the heater unit 7 while rotating the rotary table 2 clockwise at a rotational speed of, for example, 20 rpm.

Thereafter, a Si-containing gas and an $O_3$ gas are respectively injected from the process gas nozzles 31 and 32. Furthermore, if necessary, a mixed gas of an Ar gas, an $O_2$ gas and a $H_2$ gas mixed at a predetermined flow rate ratio is supplied from the plasma gas nozzle 33 into the vacuum container 1. High-frequency power of, for example, 700 W, is supplied from a high-frequency power source to an antenna of the plasma generator 80. Thus, plasma is generated and a film as formed is modified.

While the rotary table 2 makes one revolution, a silicon oxide film is formed on the wafer W in the following manner. Specifically, when the wafer W initially passes through the first processing region P1 under the process gas nozzle 31, the Si-containing gas is adsorbed onto the surface of the wafer W. The Si-containing gas may be, for example, an organic aminosilane gas, specifically a diisopropylaminosilane gas. Then, when the wafer W passes through the second processing region P2 under the process gas nozzle 32, the Si-containing gas existing on the wafer W is oxidized by the $O_3$ gas supplied from the process gas nozzle 32. Thus, one molecular layer (or several molecular layers) of silicon oxide is formed. Subsequently, when the wafer W passes through the underside of the plasma generator 80, the silicon oxide layer on the wafer W is exposed to active oxygen species and active hydrogen species. The active oxygen species such as oxygen radicals or the like act to oxidize, for example, an organic substance contained in the Si-containing gas and remaining in the silicon oxide layer so that the organic substance is removed from the silicon oxide layer. This makes it possible to increase the purity of the silicon oxide layer.

Under the rotary table 2, there is formed a communication space S through which the $O_3$ gas can reach the first exhaust port 610. However, since the conductance reduction block 90 is installed in the vicinity of the first exhaust port 610, the conductance in the vicinity of the first exhaust port 610 is reduced. Thus, the $O_3$ gas does not reach the first exhaust port 610 but is exhausted from the second exhaust port 620 together with the Ar gas or the like. Thus, it is possible to prevent formation of an unnecessary silicon oxide film in the first exhaust port 610.

After the rotary table 2 is rotated by a revolution number required in forming a silicon oxide film having a desired thickness, the substrate processing is completed by stopping the supply of the Si-containing gas, the $O_3$ gas and the mixed gas of the Ar gas, the $O_2$ gas and the $NH_3$ gas, which is supplied if necessary. Subsequently, the supply of the Ar gas or the $N_2$ gas from the separation gas nozzles 41 and 42, the separation gas supply pipe 51 and the purge gas supply pipes 72 and 73 is also stopped and the rotation of the rotary table 2 is stopped. Thereafter, the wafers W are unloaded from the interior of the vacuum container 1 in the order opposite to the order of loading the wafers W into the vacuum container 1.

In the present embodiment, there has been described an example in which the silicon-containing gas is used as the raw material gas and the oxidizing gas is used as the reaction gas. However, it may be possible to use many different combinations of the raw material gas and the reaction gas. For example, a silicon nitride film may be formed by using a silicon-containing gas as the raw material gas and using a nitriding gas such as ammonia or the like as the reaction gas. Furthermore, a titanium nitride film may be formed by using a titanium-containing gas as the raw material gas and using a nitriding gas as the reaction gas. In this way, the raw material gas may be selected from various gases such as an organic metal gas and the like. As the reaction gas, it may be possible to use various reaction gases such as an oxidizing gas, a nitriding gas and the like capable of reacting with a raw material gas and generating a reaction product.

Next, descriptions will be made on the simulation results obtained in the case where the substrate processing is performed using the substrate processing apparatus according to the embodiment of the present disclosure.

FIGS. 12A to 12D are views illustrating the simulation results according to Example 1. The simulation results according to Example 1 are simulation results obtained by installing the conductance reduction block 90, setting the internal pressure of the vacuum container 1 at 4 Torr and moving the rotary table 2 upward. As other substrate processing conditions, the internal temperature of the vacuum container 1 was set at 400 degrees C. and the rotational speed of the rotary table 2 was set at 20 rpm. An Ar gas was used as the separation gas. The Ar gas was supplied at a flow rate of 3 slm from the separation gas supply pipe 51 existing above the rotary shaft 22, at a flow rate 1.8 slm from the purge gas supply pipe 72 existing under the rotary shaft 22, and at a flow rate of 5 slm from the separation gas nozzles 41 and 42. A diisopropylaminosilane gas, which is a silicon-containing gas, was used as the raw material gas and was supplied from the process gas nozzle 31 together with an Ar gas (at a flow rate of 1 slm) which is a carrier gas. An Ar gas was supplied at a flow rate of 15 slm from the plasma gas nozzle 33 and an $O_2$ gas was supplied at a flow rate of 75 sccm from the plasma gas nozzle 33. An $O_2$ gas was supplied at a flow rate of 6 slm from the process gas nozzle 32. The distance d2 between the rotary table 2 and the lid member 7a in the communication space S was set at 13 mm. The clearance between the wall surface 91 of the conductance reduction block 90 and the outer peripheral surface of the rotary table 2 was set at 2 mm.

Figure 12A:
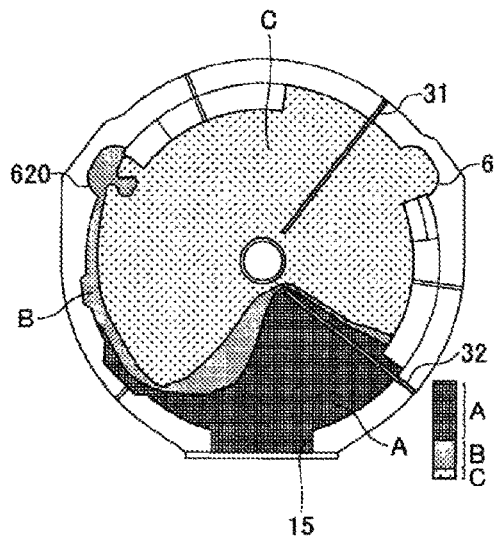
FIGS. 12A to 12D are views illustrating simulation results according to Example 1.

FIG. 12A is the simulation result showing an $O_2$ concentration distribution on the rotary table 2. In all of the simulation results illustrated in FIGS. 12A to 12D and the subsequent figures, the arrangement of the container body 12 is the same as the arrangement of the container body 12 illustrated in FIG. 11. The transfer gate 15 is disposed at the lower side of the drawing sheet surface. The first processing region P1, the process gas nozzle 31 and the first exhaust port 610 are disposed at the right upper side of the drawing sheet surface. The second exhaust port 620 corresponding to the second processing region P2 is disposed at the left upper side of the drawing sheet surface. The process gas nozzle 32 is disposed at the right lower side of the drawing sheet surface. In FIGS. 12A to 12D, the region in which a gas concentration is highest is indicated by level A. The region in which a gas concentration is low is indicated by level B. The region in which a gas concentration is hardly detected is indicated by level C.

As illustrated in FIG. 12A, on the rotary table 2, the $O_2$ concentration is at levels A and B only in the vicinity of the process gas nozzle 32. The $O_2$ concentration is at level B in the vicinity of the second exhaust port 620. The $O_2$ concentration is at level C in the vicinity of the first exhaust port 610. Oxygen is hardly detected in the vicinity of the first exhaust port 610. That is to say, it is shown that the independent exhaust of the $O_2$ gas is appropriately performed on the rotary table 2.

Figure 12B:
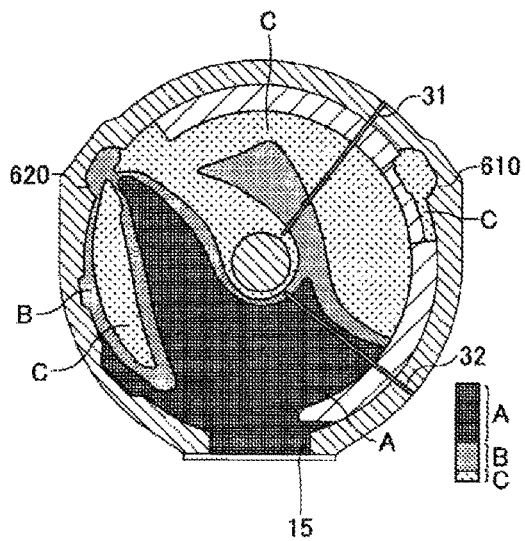

FIG. 12B is the simulation result showing an $O_2$ concentration distribution in the communication space S existing under the rotary table 2. Even in the communication space S existing under the rotary table 2, the $O_2$ concentration is at level C in the first exhaust port 610 and at level B in the second exhaust port 620. There is formed a flow of the $O_2$ gas moving toward the second exhaust port 620. Accordingly, it is shown that the phenomenon of the $O_2$ gas being exhausted from the first exhaust port 610 can be prevented by installing the conductance reduction block 90.

Figure 12C:
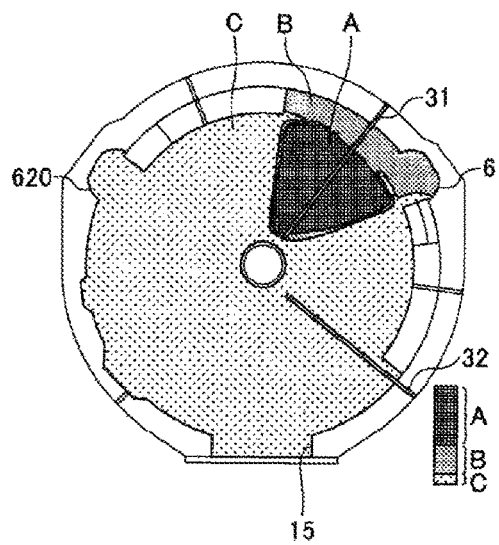

FIG. 12C is the simulation result showing a diisopropylaminosilane gas concentration distribution on the rotary table 2. As illustrated in FIG. 12C, on the rotary table 2, the diisopropylaminosilane gas concentration is at levels A and B only within the first processing region P1. The diisopropylaminosilane gas concentration is at level C in the remaining regions. Accordingly, on the rotary table 2, it is possible to realize the independent exhaust of the diisopropylaminosilane gas in the first exhaust port 610.

Figure 12D:
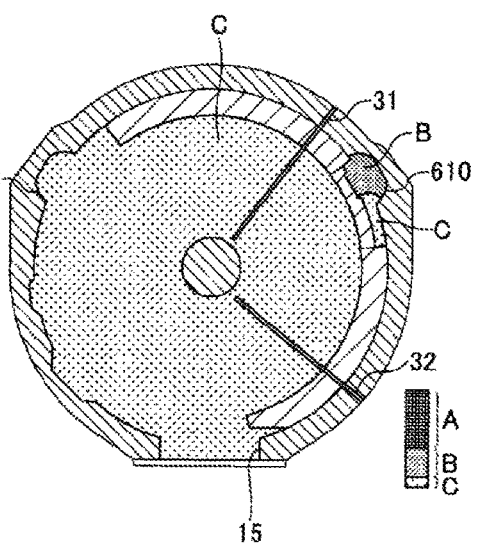

FIG. 12D is the simulation result showing a diisopropylaminosilane gas concentration distribution in the communication space S existing under the rotary table 2. As illustrated in FIG. 12D, the concentration of level B is detected only in the first exhaust port 610. The diisopropylaminosilane gas concentration is at level C in other regions. Accordingly, it can be noted that the diisopropylaminosilane gas is independently exhausted only from the first exhaust port 610.

As described above, it can be noted that by installing the conductance reduction block 90, it is possible to reduce the conductance of the $O_2$ gas moving from the process gas nozzle 32 toward the first exhaust port 610 and to independently exhaust the diisopropylaminosilane gas and the $O_2$ gas in the first and second exhaust ports 610 and 620.

FIGS. 13A to 13D are views illustrating the simulation results according to Comparative Example 1. In the simulation results according to Comparative Example 1, the wall surface 91 of the conductance reduction block 90 is not installed and only the horizontal surface 92 of the conductance reduction block 90 is installed. Other conditions and the indications of the gas concentration levels are the same as those of the simulation results according to Example 1 described with reference to FIGS. 12A to 12D.

Figure 13A:
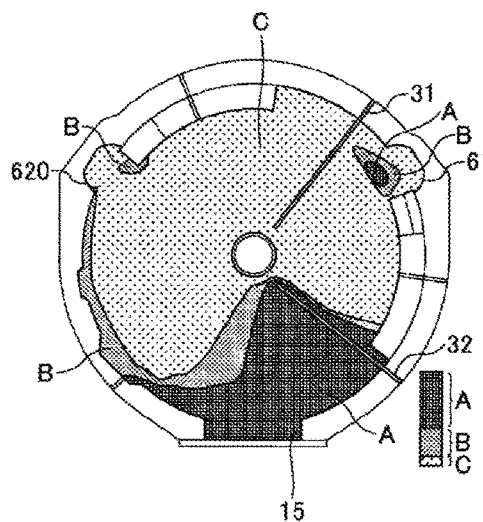
FIGS. 13A to 13D are views illustrating simulation results according to Comparative Example 1.

FIG. 13A is the simulation result showing an $O_2$ concentration distribution on the rotary table 2. As illustrated in FIG. 13A, the $O_2$ concentration of levels A and B is detected in the vicinity of the first exhaust port 610. This $O_2$ concentration is higher than level B detected in the second exhaust port 620. Infiltration of the $O_2$ gas into the first exhaust port 610 is slightly seen.

Figure 13B:
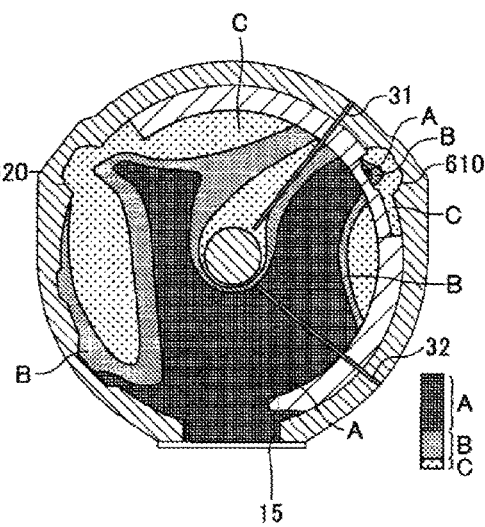

FIG. 13B is the simulation result showing an $O_2$ concentration distribution in the communication space S existing under the rotary table 2. As illustrated in FIG. 13B, the $O_2$ concentration of levels A and B is detected in the vicinity of the first exhaust port 610 and the $O_2$ concentration of level B is detected in the vicinity of the second exhaust port 620. As illustrated in FIG. 13B, if the wall surface 91 of the conductance reduction block 90 is not installed, the $O_2$ gas supplied from the process gas nozzle 32 is infiltrated into the first exhaust port 610. It is therefore impossible to perform independent exhaust.

Figure 13C:
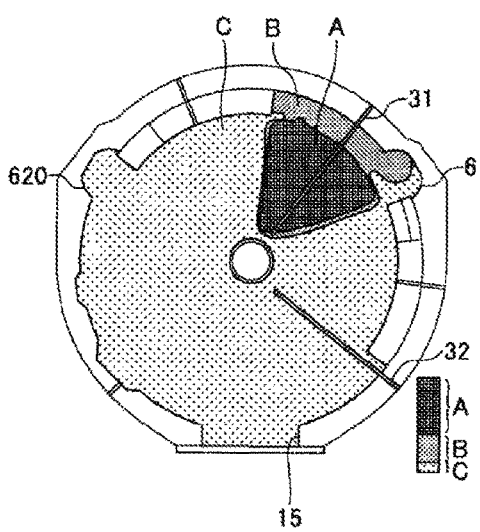

FIG. 13C is the simulation result showing a diisopropylaminosilane gas concentration distribution on the rotary table 2. As illustrated in FIG. 13C, the diisopropylaminosilane gas concentration of levels A and B is detected only in the first processing region P1 and in the vicinity of the first exhaust port 610. It can be noted that the independent exhaust of the raw material gas is appropriately performed on the rotary table 2.

Figure 13D:
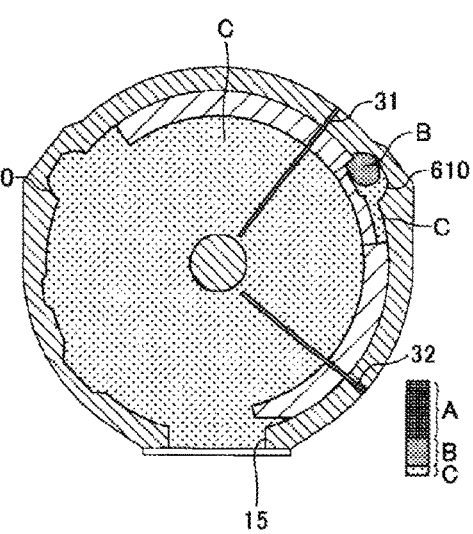

FIG. 13D is the simulation result showing a diisopropylaminosilane gas concentration distribution in the communication space S existing under the rotary table 2. As illustrated in FIG. 13D, the diisopropylaminosilane gas concentration of level B is detected only in the vicinity of the first exhaust port 610. It can be noted that the independent exhaust of the raw material gas is appropriately performed even in the communication space S existing under the rotary table 2.

As described above, in the simulation results according to Comparative Example 1, the diisopropylaminosilane gas as the raw material gas is independently exhausted from the first exhaust port 610. However, a large amount of the $O_2$ gas as the oxidizing gas flows into the first exhaust port 610 in the communication space S existing under the rotary table 2. Thus, the independent exhaust of the $O_2$ gas is not appropriately performed. Accordingly, in the simulation results according to Comparative Example 1, it is shown that if the wall surface 91 of the conductance reduction block 90 is not installed, it is difficult to appropriately perform the independent exhaust.

Figure 14A:
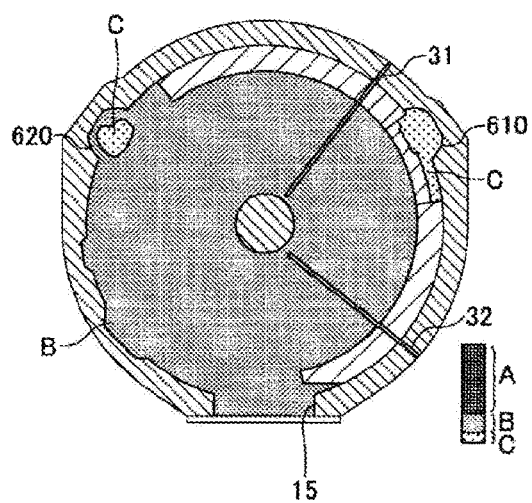
FIGS. 14A and 14B are views illustrating pressure distributions in the simulation results according to Example 1 and Comparative Example 1.
Figure 14B:
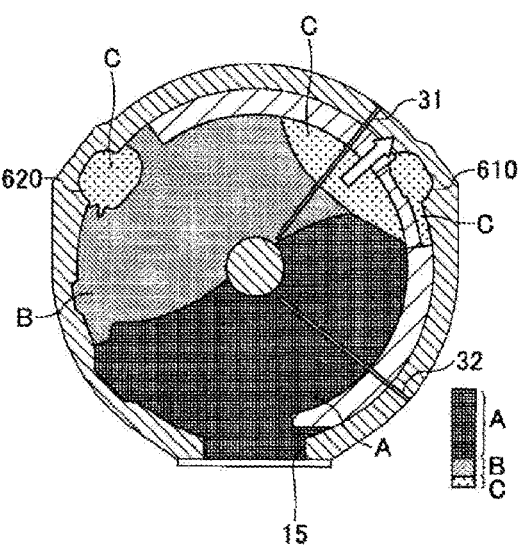

FIGS. 14A and 14B are views illustrating pressure distributions in the simulation results according to Example 1 and Comparative Example 1. In FIGS. 14A and 14B, the region in which a pressure is at a highest level is indicated by level A. The region in which a pressure is at a moderate level is indicated by level B. The region in which a pressure is at a lowest level is indicated by level C.

FIG. 14A is a view illustrating a pressure distribution in the communication space S existing under the rotary table 2 in the simulation result according to Example 1. As illustrated in FIG. 14A, by installing the conductance reduction block 90, the pressure in the region surrounded by the conductance reduction block 90 is at level B and is higher than the pressure of level C in the first exhaust port 610. This means that the $O_2$ gas entered the communication space S existing under the rotary table 2 is restrained from flowing toward the first processing region P1 which is a raw material gas supply region and further that the pressure in the communication space S of the first processing region P1 is higher than the pressure in the first exhaust port 610. Accordingly, it is shown that the installation of the conductance reduction block 90 reduces the conductance at the side of the first processing region P1.

FIG. 14B is a view illustrating a pressure distribution in the communication space S existing under the rotary table 2 in the simulation result according to Comparative Example 1. As illustrated in FIG. 14B, if the wall surface 91 of the conductance reduction block 90 is not installed, the pressure in the first exhaust port 610 and the pressure within the first processing region P1 in the vicinity of the first exhaust port 610 are at an equal level, i.e., at level C. This means that the flow of a gas moving from the communication space S existing under the rotary table 2 toward the first exhaust port 610 is not obstructed. It is shown that the infiltration of the $O_2$ gas into the first exhaust port 610 could not be prevented.

FIGS. 15A to 15D are views illustrating the simulation results according to Example 2. In the simulation according to Example 2, the same processing conditions as those of the simulation according to Example 1 were used except that the internal pressure of the vacuum container 1 is set at 7 Torr.

Figure 15A:
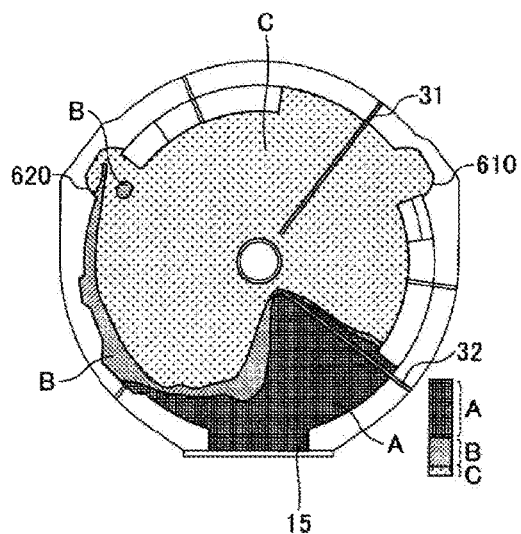
FIGS. 15A to 15D are views illustrating simulation results according to Example 2.
Figure 15B:
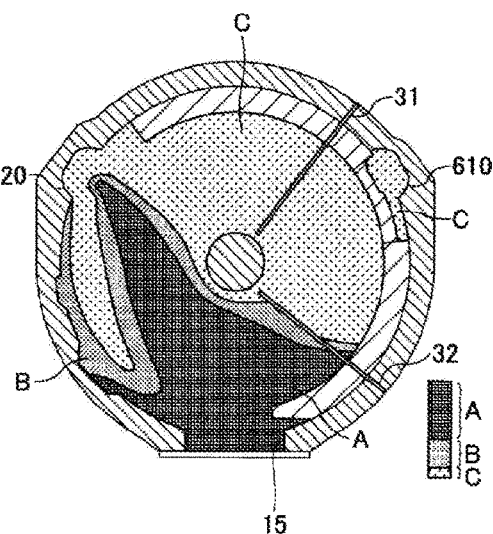
Figure 15C:
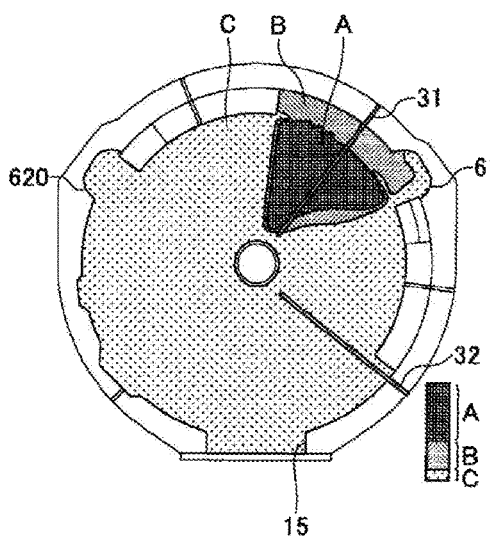
Figure 15D:
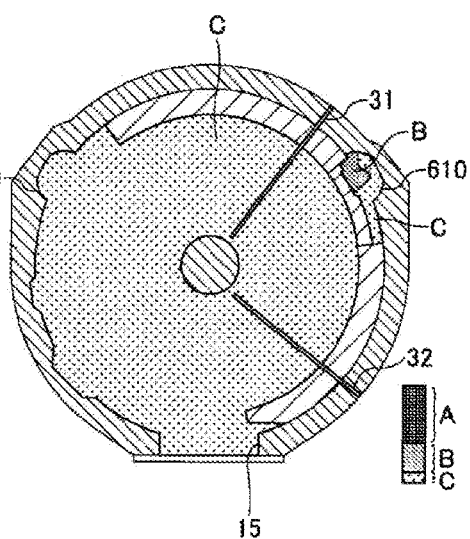

FIG. 15A is the simulation result showing an $O_2$ concentration distribution on the rotary table 2. FIG. 15B is the simulation result showing an $O_2$ concentration distribution in the communication space S existing under the rotary table 2. FIG. 15C is the simulation result showing a diisopropylaminosilane gas concentration distribution on the rotary table 2. FIG. 15D is the simulation result showing a diisopropylaminosilane gas concentration distribution in the communication space S existing under the rotary table 2. In FIGS. 15A to 15D, the region in which a gas concentration is highest is indicated by level A. The region in which a gas concentration is low is indicated by level B. The region in which a gas concentration is hardly detected is indicated by level C.

In FIGS. 15A to 15D, there are illustrated the simulation results which are substantially the same as the simulation results according to Example 1 illustrated in FIGS. 12A to 12D. That is to say, as illustrated in FIG. 15A, the infiltration of the $O_2$ gas into the first exhaust port 610 is not seen on the rotary table 2. Furthermore, as illustrated in FIG. 15B, the infiltration of the $O_2$ gas into the first exhaust port 610 is not seen even in the communication space S existing under the rotary table 2. The $O_2$ gas is exhausted from the second exhaust port 620.

As illustrated in FIG. 15C, on the rotary table 2, the diisopropylaminosilane gas is independently exhausted only from the first exhaust port 610. Furthermore, as illustrated in FIG. 15D, even in the communication space S existing under the rotary table 2, the diisopropylaminosilane gas is independently exhausted only from the first exhaust port 610.

As can be seen from Examples 1 and 2 illustrated in FIGS. 12A to 12D and FIGS. 15A to 15D, by installing the conductance reduction block 90, it is possible to independently exhaust the $O_2$ gas from the first exhaust port 610 even when the internal pressure of the vacuum container 1 is changed.

FIGS. 16A to 16D are views illustrating the simulation results according to Comparative Example 2. In the simulation results according to Comparative Example 2, the wall surface 91 of the conductance reduction block 90 is not installed and only the horizontal surface 92 of the conductance reduction block 90 is installed. Other conditions and the indications of the gas concentration levels are the same as those of the simulation results according to Example 2 described with reference to FIGS. 15A to 15D.

Figure 16A:
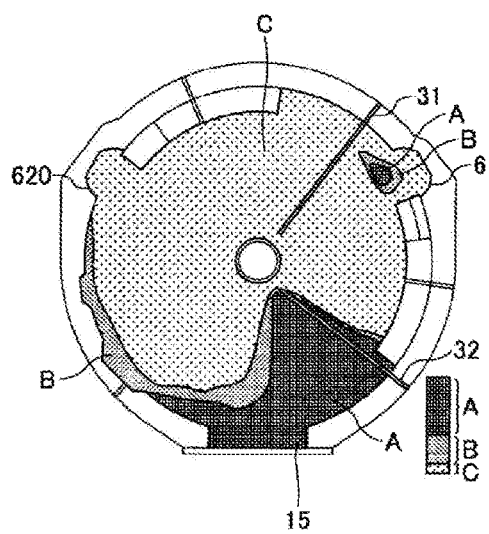
FIGS. 16A to 16D are views illustrating simulation results according to Comparative Example 2.
Figure 16B:
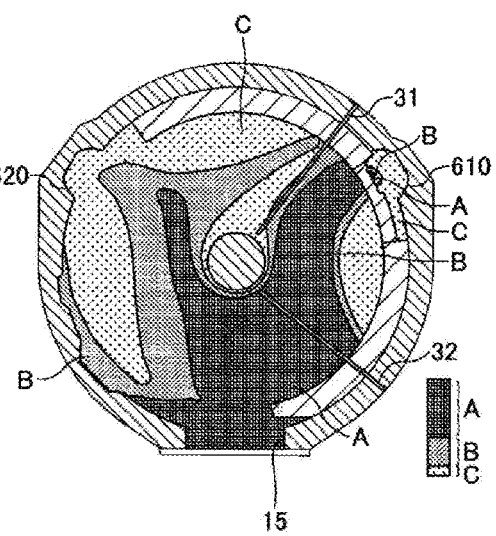
Figure 16C:
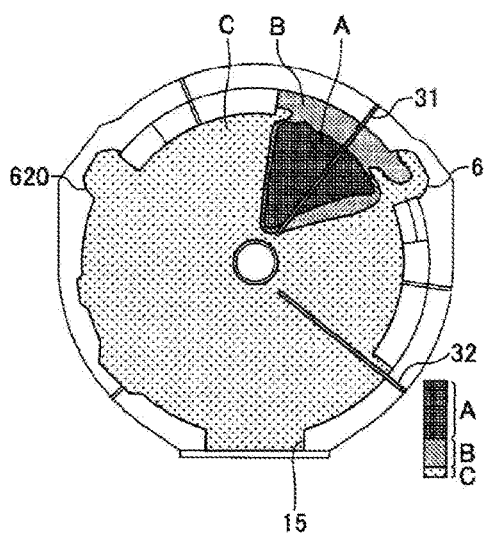
Figure 16D:
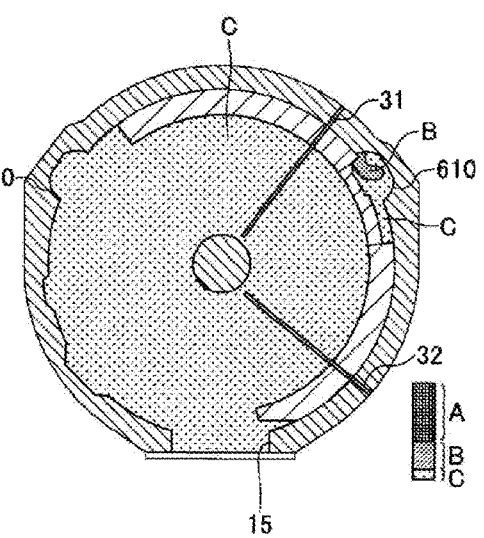

FIG. 16A is the simulation result showing an $O_2$ concentration distribution on the rotary table 2. FIG. 16B is the simulation result showing an $O_2$ concentration distribution in the communication space S existing under the rotary table 2. FIG. 16C is the simulation result showing a diisopropylaminosilane gas concentration distribution on the rotary table 2. FIG. 16D is the simulation result showing a diisopropylaminosilane gas concentration distribution in the communication space S existing under the rotary table 2.

In FIGS. 16A to 16D, there are illustrated the simulation results which are substantially the same as the simulation results according to Comparative Example 1 illustrated in FIGS. 13A to 13D. That is to say, as illustrated in FIG. 16A, the infiltration of the $O_2$ gas of level B into the first exhaust port 610 is slightly seen on the rotary table 2. Furthermore, as illustrated in FIG. 16B, in the communication space S existing under the rotary table 2, a large amount of the $O_2$ gas is infiltrated into the first exhaust port 610. The $O_2$ gas is exhausted from both the first exhaust port 610 and the second exhaust port 620.

Furthermore, as illustrated in FIG. 16C, on the rotary table 2, the diisopropylaminosilane gas is independently exhausted only from the first exhaust port 610. Furthermore, as illustrated in FIG. 16D, even in the communication space S existing under the rotary table 2, the diisopropylaminosilane gas is independently exhausted only from the first exhaust port 610.

As can be seen from Comparative Examples 1 and 2 illustrated in FIGS. 13A to 13D and FIGS. 16A to 16D, if the wall surface 91 of the conductance reduction block 90 is not installed, even when the internal pressure of the vacuum container 1 is changed, the oxidizing gas is infiltrated into the first exhaust port 610 in the communication space S existing under the rotary table 2.

Figure 17A:
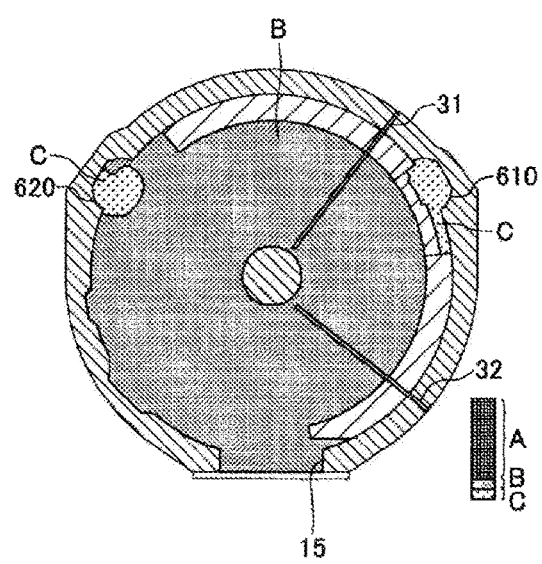
FIGS. 17A and 17B are views illustrating pressure distributions in the simulation results according to Example 2 and Comparative Example 2.
Figure 17B:
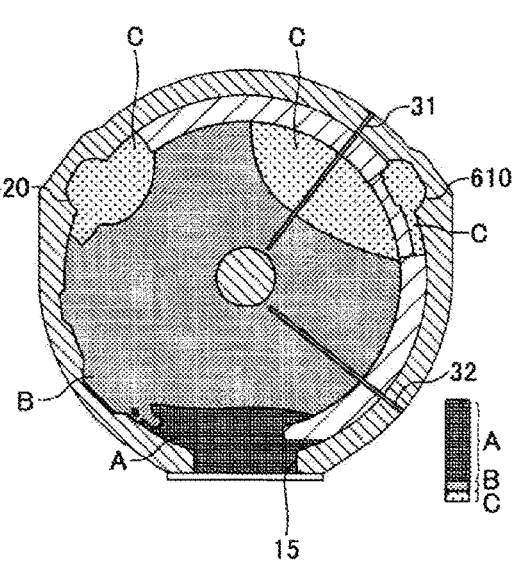

FIGS. 17A and 17B are views illustrating the pressure distributions in the simulation results according to Example 2 and Comparative Example 2. In FIGS. 17A and 17B, the region in which a pressure is at a highest level is indicated by level A. The region in which a pressure is at a moderate level is indicated by level B. The region in which a pressure is at a lowest level is indicated by level C.

FIG. 17A is a view illustrating the pressure distribution in the communication space S existing under the rotary table 2 in the simulation result according to Example 2. As illustrated in FIG. 17A, if the conductance reduction block 90 is installed, the pressure in the communication space S existing under the rotary table 2, which includes the first processing region P1, is at level B and is higher than the pressure of level C in the first exhaust port 610. This means that as described above, the $O_2$ gas entered the communication space S exiting under the rotary table 2 is restrained from flowing toward communication space S including the first processing region P1 and further that the pressure in the communication space S including the first processing region P1 is higher than the pressure in the first exhaust port 610. Accordingly, it is shown that the installation of the conductance reduction block 90 reduces the conductance at the side of the first processing region P1.

FIG. 17B is a view illustrating the pressure distribution in the communication space S existing under the rotary table 2 in the simulation result according to Comparative Example 1. As illustrated in FIG. 17B, if the wall surface 91 of the conductance reduction block 90 is not installed, the pressure in the first exhaust port 610 and the pressure within the first processing region P1 in the vicinity of the first exhaust port 610 are at an equal level, i.e., at level C. This means that the flow of a gas moving from the communication space S existing under the rotary table 2 toward the first exhaust port 610 is not obstructed. It is shown that the infiltration of the $O_2$ gas into the first exhaust port 610 could not be prevented.

In the present embodiment, there has been described an example in which the silicon-containing gas is used as the raw material gas and the oxidizing gas is used as the reaction gas. However, it may be possible to use many different combinations of the raw material gas and the reaction gas. For example, a silicon nitride film may be formed by using a silicon-containing gas as the raw material gas and using a nitriding gas such as ammonia or the like as the reaction gas. Furthermore, a titanium nitride film may be formed by using a titanium-containing gas as the raw material gas and using a nitriding gas as the reaction gas. In this way, the raw material gas may be selected from various gases such as an organic metal gas and the like. As the reaction gas, it may be possible to use various reaction gases such as an oxidizing gas, a nitriding gas and the like capable of reacting with a raw material gas and generating a reaction product.

As mentioned above, other gas supply means such as a shower head or the like may be used in place of the process gas nozzles 31 and 32 and the plasma gas nozzle 33.

Furthermore, in the aforementioned embodiment, there has been described an example in which the film forming process is performed as the substrate processing. However, the present disclosure may be applied to a substrate processing apparatus other than a film forming apparatus as long as the substrate processing apparatus is provided with a plurality of exhaust ports and is capable of independently exhausting process gases in a corresponding relationship with individual processing regions.

According to the present disclosure in some embodiments, it is possible to perform independent exhaust in a plurality of exhaust ports even when a communication space exists under a rotary table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber;
a rotary table provided within the process chamber and configured to rotate about a vertical axis and move upward and downward, the rotary table including a plurality of recesses formed on a surface of the rotary table along a rotation direction of the rotary table, and a substrate being held in each of the plurality of recesses;
a first process gas supply part installed above the rotary table and in a first location along the rotation direction, and configured to supply a first process gas to the substrate passing through a first process gas supply region formed below the first process gas supply part, with a rotation of the rotary table;
a second process gas supply part installed above the rotary table and in a second location, being different from the first location, along the rotation direction, and configured to supply a second process gas to the substrate passing through a second process gas supply region formed below the second process gas supply part, with the rotation of the rotary table;
two convex portions protruding downward from a ceiling surface of the process chamber toward the rotary table at different locations from each other along the rotation direction, wherein the first process gas supply region and the second process gas supply region are partitioned from each other by the two convex portions;
a first exhaust port formed in a bottom of the process chamber and in a third location along the rotation direction and in communication with the first process gas supply region;
a second exhaust port formed in the bottom of the process chamber and in a fourth location, which is different from the third location, along the rotation direction so as to be in communication with the second process gas supply region; and
a conductance reduction part fixedly installed in the bottom of the process chamber and between the rotary table and the first exhaust port, and configured to reduce conductance in the vicinity of the first exhaust port in a route along which the second process gas flows toward the first exhaust port through a communication space, the communication space being generated below the rotary table by upward movement of the rotary table and allowing the first exhaust port and the second exhaust port to communicate with each other.

2. The apparatus of claim 1, wherein the conductance reduction part is provided at an outer side of an outer peripheral surface of the rotary table, the conductance reduction part including a wall surface covering the communication space from an outer side of the communication space.

3. The apparatus of claim 2, wherein the conductance reduction part is disposed in the vicinity of the first exhaust port including a region which interconnects the first exhaust port and the second process gas supply part.

4. The apparatus of claim 3, wherein the conductance reduction part is provided in at least a portion of the first process gas supply region.

5. The apparatus of claim 4, wherein the conductance reduction part is provided substantially in the entirety of the first process gas supply region.

6. The apparatus of claim 2, wherein the conductance reduction part includes a horizontal surface horizontally extending outward at a predetermined width from a lower end of the wall surface and extending along the outer peripheral surface of the rotary table, the horizontal surface covering a surface in which the first exhaust port is formed.

7. The apparatus of claim 2, wherein a clearance between the outer peripheral surface of the rotary table and the wall surface of the conductance reduction part falls within a range of 0.5 to 4 mm.

8. The apparatus of claim 1, wherein the second process gas supply region is wider than the first process gas supply region,
the first exhaust port is provided in the vicinity of a downstream end of the first process gas supply region in the rotation direction of the rotary table,
the second exhaust port is provided in the vicinity of a downstream end of the second process gas supply region in the rotation direction of the rotary table, and
the second process gas supply part is provided in a position closer to the first exhaust port than the second exhaust port.

9. The apparatus of claim 1, wherein a separation gas supply part that supplies a separation gas toward the substrate is installed in each of the two convex portions, wherein the first process gas supply region and the second process gas supply region are partitioned from each other by the two convex portions and the separation gas supplied from the separation gas supply part.

10. The apparatus of claim 1, wherein the first process gas supply part supplies a raw material gas adsorbed onto the substrate, and
the second process gas supply part supplies a reaction gas reacting with the raw material gas to generate a reaction product.

11. The apparatus of claim 10, wherein the second process gas supply part supplies an oxidizing gas or a nitriding gas as the reaction gas.

12. The apparatus of claim 1, wherein the rotary table moves down when placing the substrate on the rotary table and moves up when performing substrate processing.

13. The apparatus of claim 12, wherein the substrate processing is performed by rotating the rotary table while supplying the first process gas from the first process gas supply part and while supplying the second process gas from the second process gas supply part.

* * * * *